(12) United States Patent
Hwang

(10) Patent No.: US 9,070,613 B2
(45) Date of Patent: Jun. 30, 2015

(54) LIGHT EMITTING DEVICE

(75) Inventor: Sungmin Hwang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 33 days.

(21) Appl. No.: 13/434,397

(22) Filed: Mar. 29, 2012

(65) Prior Publication Data

US 2013/0056785 A1 Mar. 7, 2013

(30) Foreign Application Priority Data

| | | |
|---|---|---|
| Sep. 7, 2011 | (KR) | 10-2011-0090803 |
| Oct. 10, 2011 | (KR) | 10-2011-0102995 |
| Oct. 13, 2011 | (KR) | 10-2011-0104728 |
| Oct. 20, 2011 | (KR) | 10-2011-0107683 |
| Nov. 23, 2011 | (KR) | 10-2011-0123139 |
| Dec. 6, 2011 | (KR) | 10-2011-0129856 |

(51) Int. Cl.
| | |
|---|---|
| H01L 33/00 | (2010.01) |
| H01L 27/15 | (2006.01) |
| H01L 29/26 | (2006.01) |
| H01L 31/12 | (2006.01) |
| H01L 25/075 | (2006.01) |
| H01L 33/38 | (2010.01) |

(52) U.S. Cl.
CPC ............ *H01L 27/15* (2013.01); *H01L 25/0756* (2013.01); *H01L 33/382* (2013.01); *H01L 33/385* (2013.01); *H01L 2933/0016* (2013.01); *H01L 2224/48091* (2013.01)

(58) Field of Classification Search
CPC ..... H01L 27/15; H01L 33/385; H01L 33/382; H01L 25/0756; H01L 2933/0016

USPC .............. 257/79, 88, 91, 94, 96, 98, 99, 103, 257/E33.001, E33.062, E25.021
See application file for complete search history.

(56) References Cited

U.S. PATENT DOCUMENTS

| | | | |
|---|---|---|---|
| 6,462,358 B1 * | 10/2002 | Lin et al. | 257/99 |
| 2005/0127374 A1 * | 6/2005 | Lin et al. | 257/79 |
| 2007/0018187 A1 * | 1/2007 | Lee et al. | 257/98 |
| 2007/0018198 A1 * | 1/2007 | Brandes et al. | 257/183 |
| 2007/0069220 A1 * | 3/2007 | Ogihara | 257/79 |
| 2009/0078955 A1 * | 3/2009 | Fan et al. | 257/98 |
| 2010/0032691 A1 * | 2/2010 | Kim | 257/88 |
| 2011/0140132 A1 * | 6/2011 | Kang et al. | 257/88 |

* cited by examiner

*Primary Examiner* — Fernando L Toledo
*Assistant Examiner* — Aaron Gray
(74) *Attorney, Agent, or Firm* — Birch, Stewart, Kolasch & Birch, LLP

(57) ABSTRACT

A light emitting device includes a first section and a second section. The first section includes a first semiconductor layer doped with a first dopant, a second semiconductor layer doped with a second dopant, and a first active layer between the first and second semiconductor layers, and the second section includes a third semiconductor layer disposed on the first section, and the third semiconductor layer having an exposed region, a fourth semiconductor layer disposed on the third semiconductor layer except for the exposed region, and a second active layer between the third and fourth semiconductor layers, a first electrode disposed on the first semiconductor layer, a second electrode disposed on the fourth semiconductor layer and a third electrode inserted into a hole in the exposed region and disposed on the exposed region and the second semiconductor layer, the third electrode electrically connected to the second and third semiconductor layers.

19 Claims, 32 Drawing Sheets

LIGHT EMITTING DEVICE

CROSS-REFERENCE TO RELATED APPLICATION

This application claims the priority benefit of Korean Patent Applications No. 10-2011-0090803, filed in Korea on Sep. 7, 2011, No. 10-2011-0102995, filed in Korea on Oct. 10, 2011, No. 10-2011-0104728, filed in Korea on Oct. 13, 2011, No. 10-2011-0107683, filed in Korea on Oct. 20, 2011, No. 10-2011-0123139, filed in Korea on Nov. 23, 2011, and No. 10-2011-0129856, filed in Korea on Dec. 6, 2011, the disclosure of which is incorporated herein by reference.

BACKGROUND

1. Field

Embodiments relate to a light emitting device.

2. Description of the Related Art

Light Emitting Diodes (LEDs) are a representative example of light emitting devices, which convert electric signals into infrared light or visible light using characteristics of compound semiconductors. Such LEDs are being utilized in home appliances, remote controllers, electronic bulletin boards, displays and various other automated machines. The application range of LEDs is gradually increasing.

Generally, miniature LEDs are fabricated into surface mount devices so as to be directly mounted on a Printed Circuit Board (PCB) and hence, an LED lamp, which serves as a display device, is being developed into a surface mount device. The surface mount device can substitute for a conventional simple lamp and is used in a variety of color on-and-off displays and letter/image displays.

Such an LED generally exhibits rectification characteristics. Therefore, when AC power is applied to the LED, the LED is repeatedly turned on/off according to the direction of current, thus having difficulty in continuously emitting light and suffering from damage due to reverse current.

Accordingly, a variety of studies into directly connecting an LED to an AC power source have recently been conducted.

BRIEF DESCRIPTION OF THE DRAWINGS

Details of the embodiments will be more clearly understood from the following detailed description taken in conjunction with the accompanying drawings, in which.

DETAILED DESCRIPTION OF EMBODIMENTS

Figure 1:
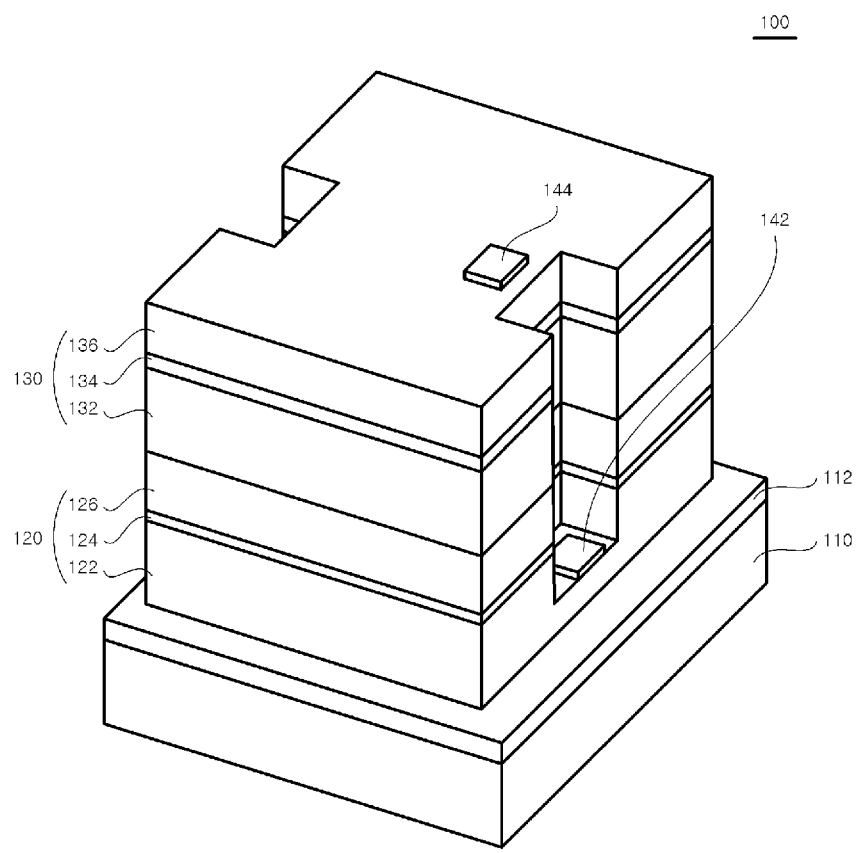
FIG. 1 is a perspective view showing a light emitting device in accordance with a first embodiment.

Reference will now be made in detail to embodiments, examples of which are illustrated in the accompanying drawings. However, the present disclosure may be embodied in many different forms and should not be construed as limited to the embodiments set forth herein. Rather, these embodiments are provided so that this disclosure will be thorough and complete, and will fully convey the scope of the disclosure to those skilled in the art. The present disclosure is defined only by the categories of the claims. In certain embodiments, detailed descriptions of device constructions or processes well known in the art may be omitted to avoid obscuring appreciation of the disclosure by a person of ordinary skill in the art. Wherever possible, the same reference numbers will be used throughout the drawings to refer to the same or like parts.

Spatially-relative terms such as "below", "beneath", "lower", "above", or "upper" may be used herein to describe one element's relationship to another element as illustrated in the Figures. It will be understood that spatially-relative terms are intended to encompass different orientations of the device in addition to the orientation depicted in the Figures. For example, if the device in one of the figures is turned over, elements described as "below" or "beneath" other elements would then be oriented "above" the other elements. The exemplary terms "below" or "beneath" can, therefore, encompass both an orientation of above and below. Since the device may be oriented in another direction, the spatially-relative terms may be interpreted in accordance with the orientation of the device.

The terminology used in the present disclosure is for the purpose of describing particular embodiments only and is not intended to limit the disclosure. As used in the disclosure and the appended claims, the singular forms "a", "an" and "the" are intended to include the plural forms as well, unless context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (comprising technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the drawings, the thickness or size of each layer is exaggerated, omitted, or schematically illustrated for convenience of description and clarity. Also, the size or area of each constituent element does not entirely reflect the actual size thereof.

Angles or directions used to describe the structures of light emitting devices according to embodiments are based on those shown in the drawings. Unless there is, in the specification, no definition of a reference point to describe angular positional relations in the structures of the light emitting devices, the associated drawings may be referred to.

Figure 2:
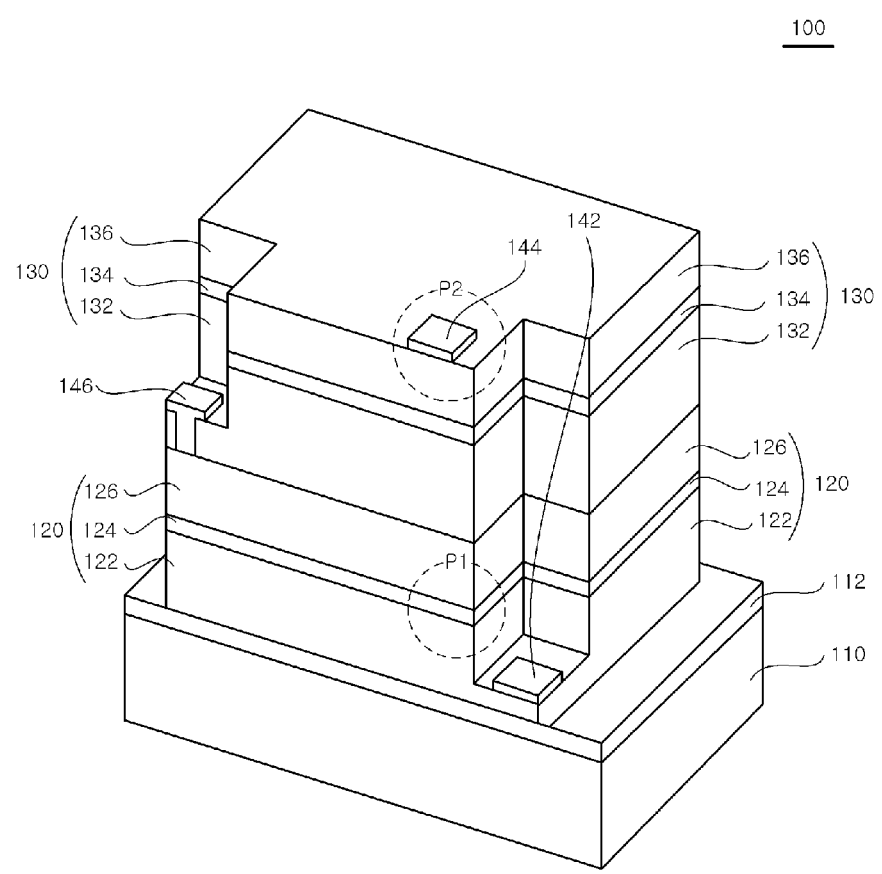
FIG. 2 is a perspective view showing a cutting plane of the light emitting device shown in FIG. 1.

FIG. 1 is a perspective view showing a light emitting device in accordance with a first embodiment, and FIG. 2 is a perspective view showing a cutting plane of the light emitting device shown in FIG. 1.

Referring to FIGS. 1 and 2, the light emitting device 100 may include a support member 110 and a light emitting structure disposed on the support member 110. The light emitting structure may include a first section 120 and a second section 130 disposed on the first section 120. The first section 120 comprises a first semiconductor layer 122 doped with a first dopant, a second semiconductor layer 126 doped with a second dopant and a first active layer 124 between the first semiconductor layer 122 and the second semiconductor layer 126. The second section 130 comprises a third semiconductor layer 132 doped with the first dopant, the third semiconductor layer 132 having an exposed region (not shown), a fourth semiconductor layer 136 doped with the second dopant, the fourth semiconductor layer 136 being disposed on the third semiconductor layer 132 except for the exposed region, and a second active layer 134 between the third semiconductor layer 132 and the fourth semiconductor layer 136. The light emitting device 100 may further include a first electrode 142 and a second electrode 144 electrically connected respectively to the first and fourth semiconductor layers 122 and 136, and a third electrode 146 electrically connected to the second and third semiconductor layers 126 and 132, the third electrode 146 being inserted into a hole (not shown) perforated in the exposed region so as to be disposed on the third semiconductor layer 132.

The support member 110 may be conductive or non-conductive and for example, may be formed of at least one selected from among sapphire ($Al_2O_3$), SiC, Si, GaAs, GaN, ZnO, Si, GaP, InP, Ge and $Ga_2O_3$.

In the first embodiment, the support member 110 is described as being non-conductive.

The support member 110 may be patterned to form a Patterned Sapphire Substrate (PSS) in order to enable wet washing for removal of foreign substances from a surface thereof as well as to enhance light extraction efficiency, although the disclosure is not limited thereto.

The support member 110 may be formed of a material suitable to ensure easy heat radiation, thereby enhancing thermal stability.

An anti-reflective layer (not shown) to enhance light extraction efficiency may be disposed on the support member 110. The anti-reflective layer is referred to as an Anti-Reflective (AR) coating layer and basically utilizes interference of light reflected from a plurality of interfaces. More specifically, the phase of light reflected from different interfaces is shifted by an angle of 180 degrees so as to be offset, which may weaken the intensity of the reflected light, although the disclosure is not limited thereto.

A buffer layer 112 may be disposed on the support member 110 and serve to relieve lattice mismatch between the support member 110 and the light emitting structure and to enable easy growth of the plurality of semiconductor layers.

The buffer layer 112 in the form of a single crystal layer may be grown on the support member 110. The single crystal buffer layer 112 may enhance crystallization of the light emitting structure to be grown on the buffer layer 112.

Specifically, the buffer layer 112 may be grown under a low temperature atmosphere and for example, may be formed of a material selected from among GaN, InN, AlN, AlInN, InGaN, AlGaN and InAlGaN and may take the form of an AlInN/GaN stack, an InGaN/GaN stack, an AlInGaN/InGaN/GaN stack or the like, although the disclosure is not limited thereto.

The first section 120, which comprises the first semiconductor layer 122, the first active layer 124 and the second semiconductor layer 126, may be formed on the buffer layer 112.

The first semiconductor layer 122 may be an n-type semiconductor layer and may provide the first active layer 124 with electrons.

In one example, assuming that the first semiconductor layer 122 is a nitride based semiconductor layer, the first semiconductor layer 122 may be formed of a semiconductor material having a composition of $In_xAl_yGa_{1-x-y}N$ ($0 \leq x \leq 1$, $0 \leq y \leq 1$, $0 \leq x+y \leq 1$). For example, the first semiconductor layer 122 may be formed of a material selected from among GaN, AlN, AlGaN, InGaN, InN, InAlGaN, AlInN and the like. Additionally, the first semiconductor layer 120 may be doped with an n-type dopant, such as Si, Ge, Sn, Se, Te and the like.

In another example, assuming that the first semiconductor layer 122 is a zinc oxide based semiconductor layer, the first semiconductor layer 122 may be formed of a semiconductor material having a composition of $In_xAl_yZn_{1-x-y}N$ ($0 \leq x \leq 1$, $0 \leq y \leq 1$, $0 \leq x+y \leq 1$). For example, the first semiconductor layer 120 may be formed of a material selected from among ZnO, AlO, AlZnO, InZnO, InO, InAlZnO, AlInN and the like. Additionally, the first semiconductor layer 120 may be doped with an n-type dopant, such as Si, Ge, Sn, Se, Te and the like.

An undoped semiconductor layer (not shown) may further be provided beneath the first semiconductor layer 122, although the disclosure is not limited thereto.

The undoped semiconductor layer serves to enhance crystallization of the first semiconductor layer 122 and may be identical to the first semiconductor layer 122 except for having lower conductivity than the first semiconductor layer 122 because it is not doped with an n-type dopant.

The first active layer 124 may be disposed on the first semiconductor layer 122. The first active layer 124 may be formed of a group III-V compound semiconductor material to have a single or multiple quantum well structure, a quantum wire structure, a quantum dot structure or the like.

In one example, assuming that the first active layer 124 has a nitride based semiconductor layer having a quantum well structure, the first active layer 124 may have a single quantum well structure comprising a well layer having a composition of $In_xAl_yGa_{1-x-y}N$ ($0 \le x \le 1$, $0 \le y \le 1$, $0 \le x+y \le 1$) and a barrier layer having a composition of $In_aAl_bGa_{1-a-b}N$ ($0 \le a \le 1$, $0 \le b \le 1$, $0 \le a+b \le 1$).

In another example, assuming that the first active layer 124 has a zinc oxide based semiconductor layer having a quantum well structure, the first active layer 124 may have a single quantum well structure comprising a well layer having a composition of $In_xAl_yZn_{1-x-y}N$ ($0 \le x \le 1$, $0 \le y \le 1$, $0 \le x+y \le 1$) and a barrier layer having a composition of $In_aAl_bZn_{1-a-b}N$ ($0 \le a \le 1$, $0 \le b \le 1$, $0 \le a+b \le 1$).

The well layer may be formed of a material having a lower band gap than the barrier layer.

If the first active layer 124 has a multiple quantum well structure, the respective well layers (not shown) and the respective barrier layers (not shown) may have different compositions, thicknesses and band gaps, although the disclosure is not limited thereto.

A conductive clad layer (not shown) may be formed above and/or below the first active layer 124. The conductive clad layer (not shown) may be formed of an AlGaN-based or AlZnO-based semiconductor and may have a greater band gap than the first active layer 124.

The second semiconductor layer 126 may be formed on the first active layer 124 and may be a p-type semiconductor layer to provide the first active layer 124 with holes.

In one example, assuming that the second semiconductor layer 126 is a nitride based semiconductor layer, the second semiconductor layer 126 may be formed of a semiconductor material having a composition of $In_xAl_yGa_{1-x-y}N$ ($0 \le x \le 1$, $0 \le y \le 1$, $0 \le x+y \le 1$). For example, the second semiconductor layer 126 may be formed of a material selected from among GaN, AlN, AlGaN, InGaN, InN, InAlGaN, AlInN and the like. Additionally, the second semiconductor layer 140 may be doped with a p-type dopant, such as Mg, Zn, Ca, Sr, Ba and the like.

In another example, assuming that the second semiconductor layer 126 is a zinc oxide based semiconductor layer, the second semiconductor layer 126 may be formed of a semiconductor material having a composition of $In_xAl_yZn_{1-x-y}N$ ($0 \le x \le 1$, $0 \le y \le 1$, $0 \le x+y \le 1$). For example, the first semiconductor layer 120 may be formed of a material selected from among ZnO, AlO, AlZnO, InZnO, InO, InAlZnO, AlInN and the like. Additionally, the second semiconductor layer 126 may be doped with a p-type dopant, such as Mg, Zn, Ca, Sr, Ba and the like.

The first semiconductor layer 122, the first active layer 124 and the second semiconductor layer 126 as described above, for example, may be formed using Metal Organic Chemical Vapor Deposition (MOCVD), Chemical Vapor Deposition (CVD), Plasma Enhanced Chemical Vapor Deposition (PECVD), Molecular Beam Epitaxy (MBE), Hydride Vapor Phase Epitaxy (HVPE), sputtering and the like, although the disclosure is not limited thereto.

The dopant contained in the first semiconductor layer 122 and the second semiconductor layer 126 may have an even or uneven doping density. In other words, the plurality of semiconductor layers may be formed respectively within a wide doping density range, although the disclosure is not limited thereto.

Alternatively, the first semiconductor layer 122 may be a p-type semiconductor layer, the second semiconductor layer 126 may be an n-type semiconductor layer, and an additional semiconductor layer (not shown), which comprises an n-type or p-type semiconductor layer, may be formed on the second semiconductor layer 126. Accordingly, the first light emitting structure 120 may have at least one among np, pn, npn and pnp junction structures.

The second section 130, which comprises the third semiconductor layer 132, the second active layer 134 and the fourth semiconductor layer 136, may be formed on the first section 120.

The third semiconductor layer 132 may be disposed on the second semiconductor layer 126 and may be doped with an n-type dopant in the same manner as the first semiconductor layer 122.

Specifically, the third semiconductor layer 132 may be an n-type semiconductor layer and may provide the second active layer 134 with electrons.

In one example, assuming that the third semiconductor layer 132 is a nitride based semiconductor layer, the third semiconductor layer 132 may be formed of a semiconductor material having a composition of $In_xAl_yGa_{1-x-y}N$ ($0 \le x \le 1$, $0 \le y \le 1$, $0 \le x+y \le 1$). For example, the third semiconductor layer 132 may be formed of a material selected from among GaN, AlN, AlGaN, InGaN, InN, InAlGaN, AlInN and the like. Additionally, the first semiconductor layer 120 may be doped with an n-type dopant, such as Si, Ge, Sn, Se, Te and the like.

In another example, assuming that the third semiconductor layer 132 is a zinc oxide based semiconductor layer, the first semiconductor layer 122 may be formed of a semiconductor material having a composition of $In_xAl_yZn_{1-x-y}N$ ($0 \le x \le 1$, $0 \le y \le 1$, $0 \le x+y \le 1$). For example, the first semiconductor layer 120 may be formed of a material selected from among ZnO, AlO, AlZnO, InZnO, InO, InAlZnO, AlInN and the like. Additionally, the first semiconductor layer 120 may be doped with an n-type dopant, such as Si, Ge, Sn, Se, Te and the like.

The second active layer 134 may be disposed on the third semiconductor layer 132. The second active layer 134 may be formed of a group III-V compound semiconductor material to have a single or multiple quantum well structure, a quantum wire structure, a quantum dot structure or the like.

In one example, assuming that the second active layer 134 has a nitride based semiconductor layer having a quantum well structure, the second active layer 134 may have a single quantum well structure comprising a well layer having a composition of $In_xAl_yGa_{1-x-y}N$ ($0 \le x \le 1$, $0 \le y \le 1$, $0 \le x+y \le 1$) and a barrier layer having a composition of $In_aAl_bGa_{1-a-b}N$ ($0 \le a \le 1$, $0 \le b \le 1$, $0 \le a+b \le 1$).

In another example, assuming that the second active layer 134 has a zinc oxide based semiconductor layer having a quantum well structure, the second active layer 134 may have a single quantum well structure comprising a well layer having a composition of $In_xAl_yZn_{1-x-y}N$ ($0 \le x \le 1$, $0 \le y \le 1$, $0 \le x+y \le 1$) and a barrier layer having a composition of $In_aAl_bZn_{1-a-b}N$ ($0 \le a \le 1$, $0 \le b \le 1$, $0 \le a+b \le 1$).

The well layer may be formed of a material having a lower band gap than the barrier layer.

If the second active layer 134 has a multiple quantum well structure, the respective well layers (not shown) and the respective barrier layers (not shown) may have different compositions, thicknesses and band gaps, although the disclosure is not limited thereto.

A conductive clad layer (not shown) may be formed above and/or below the second active layer 134. The conductive clad layer (not shown) may be formed of an AlGaN-based or AlZnO-based semiconductor and may have a greater band gap than the second active layer 134.

The fourth semiconductor layer 136 may be formed on the second active layer 134 and may be a p-type semiconductor layer to provide the second active layer 134 with holes.

In one example, assuming that the fourth semiconductor layer 136 is a nitride based semiconductor layer, the fourth semiconductor layer 136 may be formed of a semiconductor material having a composition of $In_xAl_yGa_{1-x-y}N$ ($0 \leq x \leq 1$, $0 \leq y \leq 1$, $0 \leq x+y \leq 1$). For example, the fourth semiconductor layer 136 may be formed of a material selected from among GaN, AlN, AlGaN, InGaN, InN, InAlGaN, AlInN and the like. Additionally, the fourth semiconductor layer 136 may be doped with a p-type dopant, such as Mg, Zn, Ca, Sr, Ba and the like.

In another example, assuming that the fourth semiconductor layer 136 is a zinc oxide based semiconductor layer, the fourth semiconductor layer 136 may be formed of a semiconductor material having a composition of $In_xAl_yZn_{1-x-y}N$ ($0 \leq x \leq 1$, $0 \leq y \leq 1$, $0 \leq x+y \leq 1$). For example, the fourth semiconductor layer 136 may be formed of a material selected from among ZnO, AlO, AlZnO, InZnO, InO, InAlZnO, AlInN and the like. Additionally, the fourth semiconductor layer 136 may be doped with a p-type dopant, such as Mg, Zn, Ca, Sr, Ba and the like.

The third semiconductor layer 132, the second active layer 134 and the fourth semiconductor layer 136 as described above, for example, may be formed using Metal Organic Chemical Vapor Deposition (MOCVD), Chemical Vapor Deposition (CVD), Plasma Enhanced Chemical Vapor Deposition (PECVD), Molecular Beam Epitaxy (MBE), Hydride Vapor Phase Epitaxy (HVPE), sputtering and the like, although the disclosure is not limited thereto.

The dopant contained in the third semiconductor layer 132 and the fourth semiconductor layer 136 may have an even or uneven doping density. In other words, the plurality of semiconductor layers may be formed respectively within a wide doping density range, although the disclosure is not limited thereto.

Alternatively, the third semiconductor layer 132 may be a p-type semiconductor layer, the fourth semiconductor layer 136 may be an n-type semiconductor layer, and an additional semiconductor layer (not shown), which comprises an n-type or p-type semiconductor layer, may be formed on the fourth semiconductor layer 136. Accordingly, the second light emitting structure 130 may have at least one among np, pn, npn and pnp junction structures.

The first and second sections 120 and 130 may be integrally formed with each other and for example, may be sequentially grown in a single growth process, although the disclosure is not limited thereto.

Additionally, the first and second sections 120 and 130 may be formed of the same material, although the disclosure is not limited thereto. As described above, the first and second sections 120 and 130 may respectively have at least one among np, pn, npn and pnp junction structures. Accordingly, the light emitting device 100 may have at least one among npnp, nppn, npnpn, nppnp, pnnp, pnpn, pnnpn, pnpnp, npnnp, npnpn, npnnpn, npnpnp, pnpnp, pnppn, pnpnpn, pnppnp junction structures, although the disclosure is not limited thereto.

The first and second sections 120 and 130 may emit different wavelengths of light and may emit different quantities of light.

For example, the quantity of light emitted from the first section 120 may be greater than the quantity of light emitted from the second section 130, in consideration of loss caused upon passing through the second section 130.

To this end, a thickness of the first section 120 may be equal to or greater than a thickness of the second section 130, although the disclosure is not limited thereto.

The first and second sections 120 and 130 may have different configurations, materials, thicknesses, compositions and sizes, although the disclosure is not limited thereto.

In the first embodiment, although the light emitting structure has been described as taking the form of a stack of the first and second sections 120 and 130, three or more sections may be stacked, but not limited thereto.

The first electrode 142 may be disposed on the first semiconductor layer 122, the second electrode 144 may be disposed on the fourth semiconductor layer 136, and the third electrode 146 may be disposed on the second and third semiconductor layers 126 and 132.

The first electrode 142 may be disposed on a non-overlapping region (not shown) of the first semiconductor layer 122 where the first semiconductor layer 122 does not overlap with the first active layer 124, the second semiconductor layer 126 and the second section 130 and is exposed to the outside.

In this case, the non-overlapping region may be obtained by etching lateral surfaces of the first and second sections 120 and 130 to expose a part of the first semiconductor layer 122 to the outside, although the disclosure is not limited thereto.

The second electrode 144 may be disposed on the fourth semiconductor layer 136 and may be electrically connected to the first electrode 142 via a wire (not shown) and a connecting electrode (not shown). This will be described in detail hereinafter.

The third electrode 146 may be inserted into the hole (not shown) perforated in the exposed region of the third semiconductor layer 132, such that a part of the third electrode 146 is disposed on the exposed region of the third semiconductor layer 132 and the other part is disposed on the second semiconductor layer 126. As such, the third electrode 146 may be electrically connected to the second and third semiconductor layers 126 and 132.

A depth of the hole may be in a range of 1 to 3 times a thickness of the third semiconductor layer 132 in the exposed region, and a width of the hole may be in a range of 0.3 to 0.9 times a width of the exposed region, although the disclosure is not limited thereto.

The exposed region of the third semiconductor layer 132 may be obtained by etching, in the same manner as the above described non-overlapping region of the first semiconductor layer 122, although the disclosure is not limited thereto.

Specifically, although the third electrode 146 is illustrated as being disposed on a surface of the second semiconductor layer 126, the third electrode 146 may be disposed within the second semiconductor layer 126.

In other words, the second semiconductor layer 126 may be provided with at recess (not shown) at a position corresponding to the hole, and the third electrode 146 may be accommodated in the recess so as to be electrically connected to an inner surface of the second semiconductor layer 126.

A width of the recess may be in a range of 0.5 to 1 times a width of the hole, although the disclosure is not limited thereto.

The exposed region and the non-overlapping region may be obtained by a certain etching method, and the etching method may be a wet etching or dry etching method, although the disclosure is not limited thereto.

For example, the etching method may be a mesa etching method. Specifically, a part of the first section 120 may be subjected to first mesa etching, so as to expose the non-overlapping region of the first semiconductor layer 122, and a part of the second section 130 may be subjected to second mesa etching, so as to expose the exposed region of the third semiconductor layer 132.

The first to third electrodes 142, 144 and 146 may be formed of a conductive material, for example, a metal selected from among In, Co, Si, Ge, Au, Pd, Pt, Ru, Re, Mg, Zn, Hf, Ta, Rh, Ir, W, Ti, Ag, Cr, Mo, Nb, Al, Ni, Cu and WTi, or may contain alloys thereof, and may contain a light transmissive conductive material, such as IZO, IZTO, IAZO, IGZO, IGTO, AZO, ATO and the like, as well as the metal, although the disclosure is not limited thereto.

At least one of the first to third electrodes 142, 144 and 146 may have a single layer or multi-layer form, although the disclosure is not limited thereto.

Although the first and second sections 120 and 130 of the light emitting device 100 are illustrated in FIGS. 1 and 2 as having flat lateral surfaces, each of the first and second sections 120 and 130 may be provided on at least one lateral surface thereof with a first light extraction pattern (not shown) to prevent total reflection of light, which may prevent light from being scattered or reabsorbed in the first and second sections 120 and 130.

In addition, although the support member 110 is illustrated as having flat upper and lateral surfaces, a second light extraction pattern (not shown) may be formed on at least one of the upper and lateral surfaces.

The first light extraction pattern may be formed on at least one lateral surface of the first and second sections 120 and 130, or may be formed on several or all lateral surfaces of the first and second sections 120 and 130, although the disclosure is not limited thereto.

The first light extraction pattern may be formed on the at least one lateral surface of the first and second sections 120 and 130 by Photo Electro Chemical (PEC) etching or wet etching using etching solution, such as KOH solution.

In this case, the first light extraction pattern may have a length in a range of 0.1 µm to 3 µm, and may be defined by random and irregular ridges.

The first light extraction pattern may include at least one of a textured pattern, a ridged pattern and an uneven pattern.

The cross section of the first light extraction pattern may have various shapes, such as a cylindrical shape, a polyprismatic shape, a conical shape, a polypyramidal shape, a truncated conical shape, a truncated polypyramidal shape and the like, although the disclosure is not limited thereto.

In the embodiment, the first and second sections 120 and 130 may have an angle in a range of 50° to 90° on the basis of the surface of the support member 110, although the disclosure is not limited thereto.

The second light extraction pattern may be formed by a certain etching process, a laser scribing process or the like, during fabrication of the support member 110, although the disclosure is not limited thereto.

Specifically, the second light extraction pattern may have at least one of a semicircular shape, a polygonal shape and a horn-like shape, although the disclosure is not limited thereto.

Figure 3:
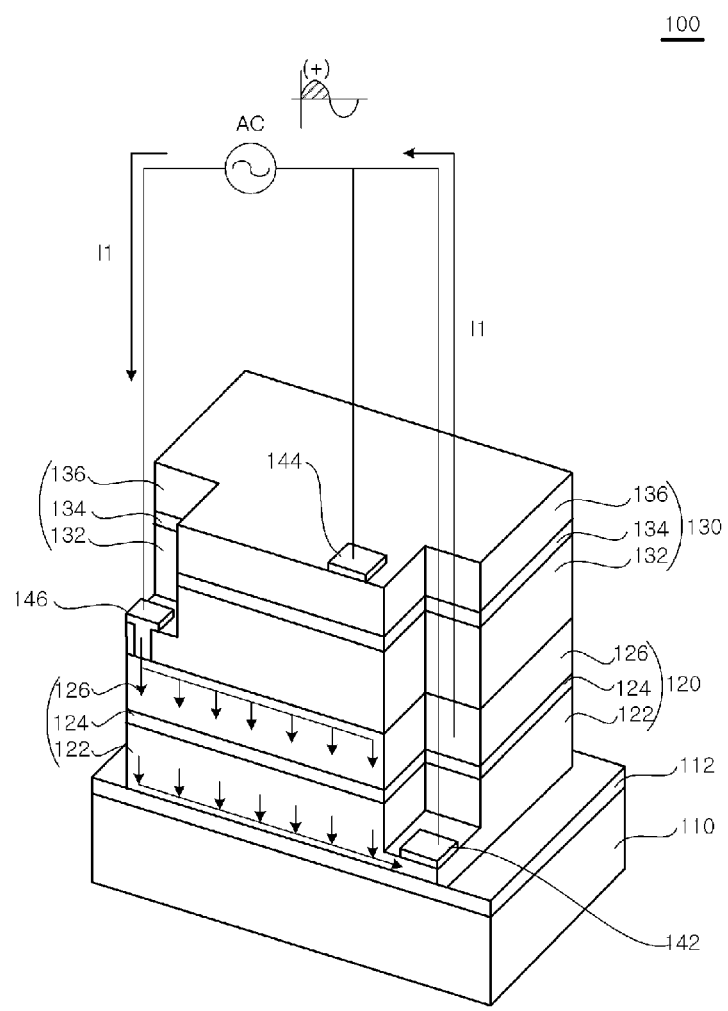
FIG. 3 is a perspective view showing light emitting operation when forward bias is applied to the light emitting device shown in FIG. 1.
Figure 4:
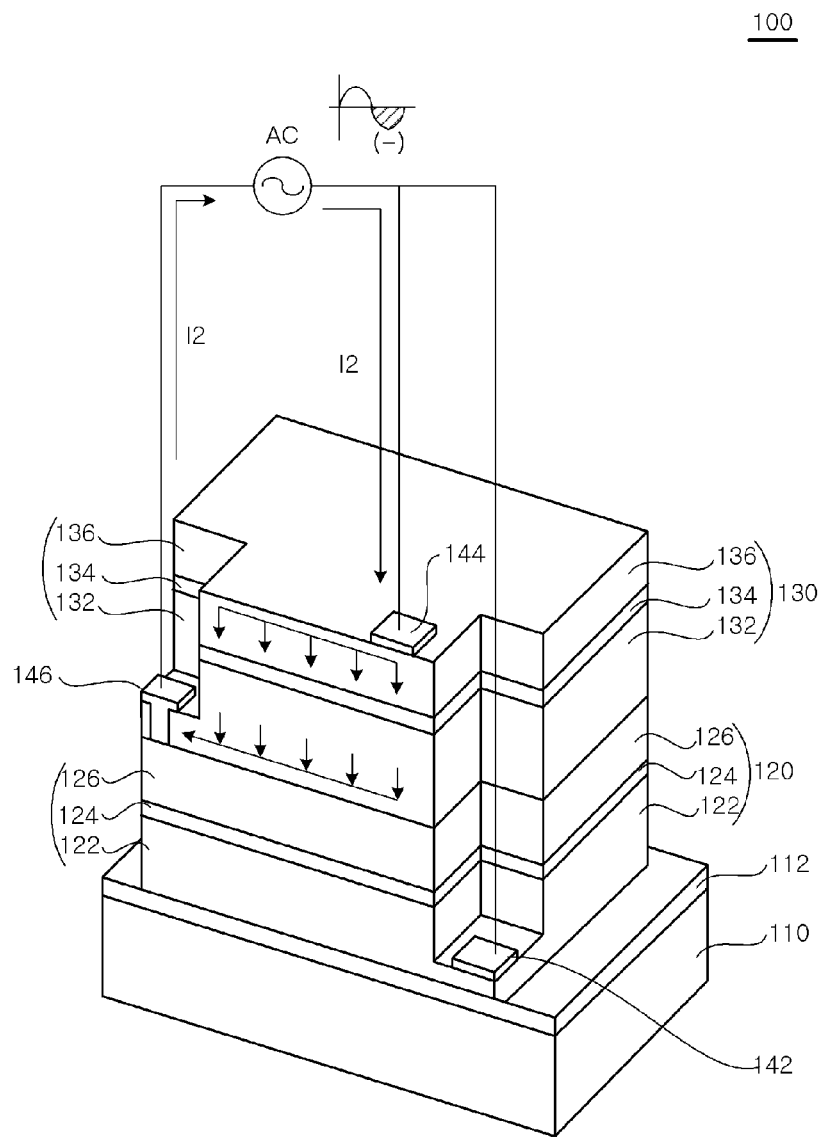
FIG. 4 is a perspective view showing light emitting operation when reverse bias is applied to the light emitting device shown in FIG. 1.

FIG. 3 is a perspective view showing light emitting operation when forward bias is applied to the light emitting device shown in FIG. 1, and FIG. 4 is a perspective view showing light emitting operation when reverse bias is applied to the light emitting device shown in FIG. 1.

An AC power source illustrated in FIGS. 3 and 4 may be electrically connected at one side thereof to the third electrode 146 and may be electrically connected at the other side thereof to the first and second electrodes 142 and 144.

The first and third semiconductor layers 122 and 132 are described as being n-type semiconductor layers, and the second and fourth semiconductor layers 126 and 136 are described as being p-type semiconductor layers.

Referring to FIG. 3, if the positive half cycle of forward bias from the AC power source is applied to the third electrode 146, the second semiconductor layer 126 may inject holes into the first active layer 124 and the first semiconductor layer 122 may inject electrons into the first active layer 124, whereby the light emitting device 100 may emit light via electron-hole coupling in the first active layer 124 of the first section 120.

In this case, the first section 120 may define a current passage path from the second semiconductor layer 126 to the first semiconductor layer 122 and consequently, may allow first current I1 to flow from the third electrode 146 to the first electrode 142.

That is, during the positive half cycle of forward bias from the AC power source, the current passage path may be defined to apply the first current I1 from the p-type semiconductor layer to the n-type semiconductor layer.

Referring to FIG. 4, if the negative half cycle of reverse bias from the AC power source is applied to the second electrode 144, the fourth semiconductor layer 136 may inject holes into the second active layer 134 and the third semiconductor layer 132 may inject electrons into the second active layer 134, whereby the light emitting device 100 may emit light via electron-hole coupling in the second active layer 134 of the second section 130.

In this case, the second section 130 may define a current passage path from the fourth semiconductor layer 136 to the third semiconductor layer 132 and consequently, may allow second current I2 to flow from the second electrode 144 to the third electrode 146.

Here, the positive half cycle of forward bias and the negative half cycle of reverse bias may be equal to each other on the basis of a ground voltage.

More specifically, during the negative half cycle of reverse bias, a great electric potential difference may occur between one side and the other side of the AC power source. Thus, the negative half cycle of reverse bias may exhibit the same current flow between the p-type and n-type semiconductor layers as the positive half cycle of forward bias.

That is, during the negative half cycle of reverse bias from the AC power source, the current passage path may be defined to apply the second current I2 from the p-type semiconductor layer to the n-type semiconductor layer.

As illustrated in FIGS. 3 and 4, the light emitting device 100 may emit light upon receiving both the forward bias and the reverse bias from the AC power source AC.

Accordingly, the light emitting device 100 does not need a separate rectifier circuit during supply of AC power, and the number of the light emitting devices 100 may be determined according to the voltage consumed by the light emitting devices 100, although the disclosure is not limited thereto.

The light emitting device 100 in the form of a single chip may emit light upon receiving both the forward bias and the reverse bias, thereby exhibiting enhanced light emission efficiency on a per unit area basis thereof.

Further, since the light emitting device 100 defines the current passage path with respect to the forward bias and the reverse bias, the light emitting device 100 may be free from damage due to Electro Static Discharge (ESD) and may do not require a separate ESD protecting device.

Figure 5:
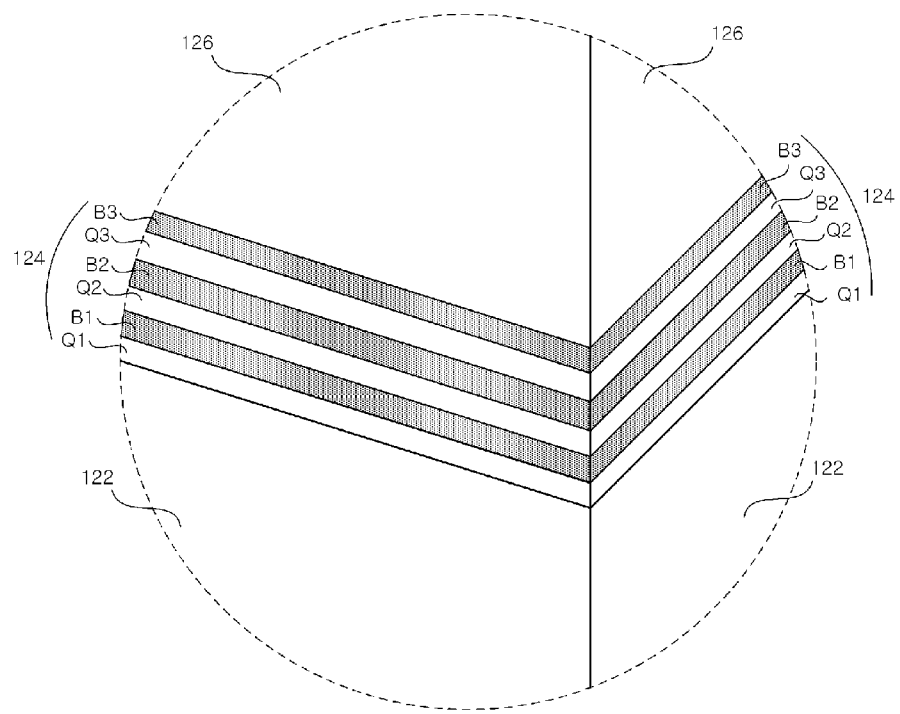
FIG. 5 is an enlarged perspective view showing the cross section of a P1 block with respect to a first active layer of the light emitting device shown in FIG. 2.
Figure 6:
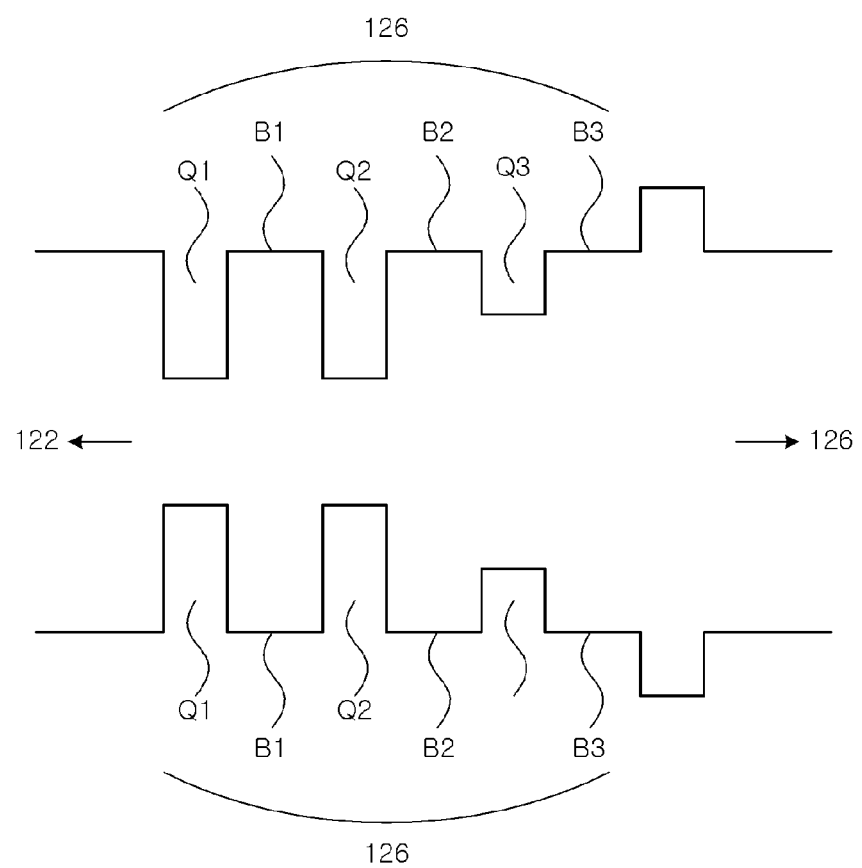
FIGS. 6 and 7 are views showing an embodiment of an energy band gap of the first active layer shown in FIG. 5.
Figure 7:
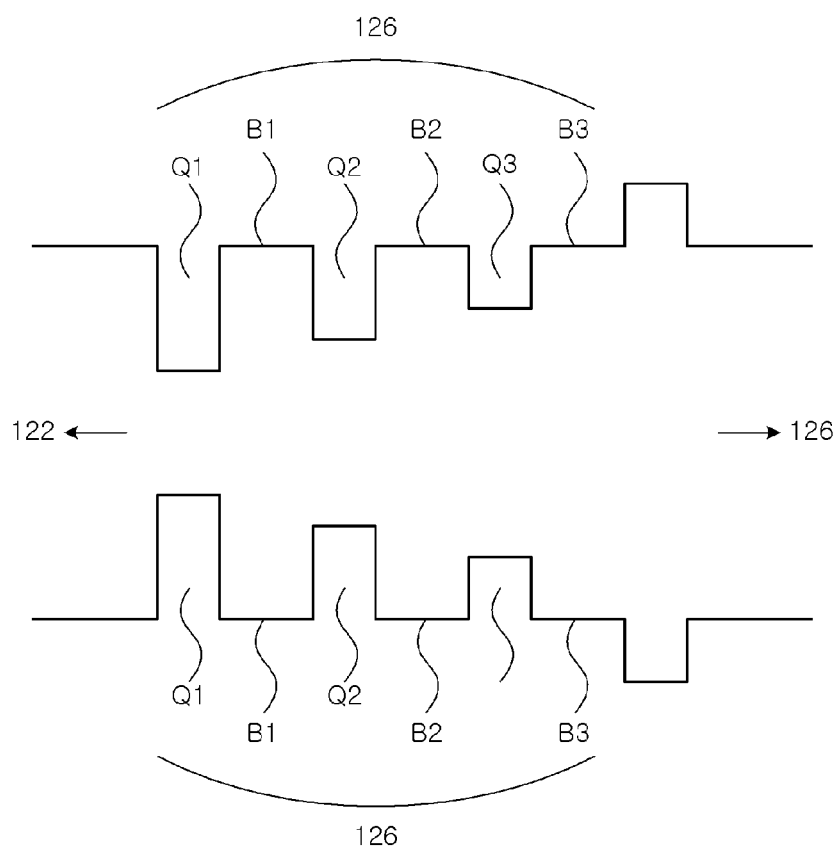

FIG. 5 is an enlarged perspective view showing the cross section of a P1 block with respect to the first active layer of the light emitting device shown in FIG. 2, and FIGS. 6 and 7 are views showing an embodiment of an energy band gap of the first active layer shown in FIG. 5.

Referring to FIG. 5, the first active layer 124 of the light emitting device 100 may have a multiple quantum well structure. For example, the first active layer 124 may include first to third well layers Q1, Q2 and Q3 and first to third barrier layers B1, B2 and B3.

In FIG. 5, the first active layer 124 is illustrated as having a multiple quantum well structure and the second active layer 134 is illustrated as having the same structure as the first active layer 124.

The first to third well layers Q1, Q2 and Q3 and the first to third barrier layers B1, B2 and B3 may be alternately stacked one above another.

Although FIG. 5 illustrates the first to third well layers Q1, Q2 and Q3 and the first to third barrier layers B1, B2 and B3 alternately stacked one above another, the disclosure is not limited thereto.

The first to third well layers Q1, Q2 and Q3 and the first to third barrier layers B1, B2 and B3 may be provided in arbitrary numbers and may also have arbitrary arrangements. In addition, as described above, the first to third well layers Q1, Q2 and Q3 and the first to third barrier layers B1, B2 and B3 may have different material composition ratios, energy band gaps and thicknesses, although the disclosure is not limited thereto.

Referring to FIGS. 6 and 7, the third well layer Q3 may have a greater energy band gap than the first and second well layers Q1 and Q2.

As the third well layer Q3 of the first active layer 124 adjacent to the second semiconductor layer 126 has a greater energy band gap than the first and second well layers Q1 and Q2, it may be possible to ensure easy hole movement in the second semiconductor layer 126 and to enhance hole injection efficiency with respect to the first and second well layers Q1 and Q2.

Additionally, as the energy band gap of the third well layer Q3 is greater than that of the first and second well layers Q1 and Q2 and is smaller than that of the first to third barrier layers B1, B2 and B3, it may be possible to relieve generation of interlayer stress due to an energy band gap difference between the first to third barrier layers B1, B2 and B3 having a great energy band gap and the first to third well layers Q1, Q2 and Q3 having a smaller energy band gap than the second semiconductor layer 126, which may further enhance light emission reliability of the light emitting device 100.

As described above, the first to third well layers Q1, Q2 and Q3 may have a composition of $In_xAl_yGa_{1-x-y}N$ ($0 \leq x \leq 1$, $0 \leq y \leq 1$, $0 \leq x+y \leq 1$).

The energy band gap may decrease as the content of In in the first to third well layers Q1, Q2 and Q3 increases and on the contrary, may increase as the content of In in the first to third well layers Q1, Q2 and Q3 decreases.

For example, the content of In in the third well layer Q3 may be in a range of 90% to 99% the content of In in the first and second well layers Q1 and Q2.

In this case, if the content of In in the third well layer Q3 is less than 90%, the energy band gap of the third well layer Q3 may be excessively great and thus, a lattice constant difference between the third well layer Q3 and the first and second wall layers Q1 and Q2 may be increased, resulting in deterioration of crystallization. If the content of In in the third well layer Q3 is greater than 99%, there is no energy band gap difference between the third well layer Q3 and the first and second well layers Q1 and Q2, which has less effect on improvement of hole injection and crystallization.

The content of In may be represented by any one of a mole ratio, a volume ratio and a mass ratio, although the disclosure is not limited thereto.

As described above, the first to third well layers Q1, Q2 and Q3 may have a composition of $In_xAl_yGa_{1-x-y}N$ ($0 \leq x \leq 1$, $0 \leq y \leq 1$, $0 \leq x+y \leq 1$), and the first to third barrier layers B1, B2 and B3 may have a composition of $In_aAl_bGa_{1-a-b}N$ ($0 \leq a \leq 1$, $0 \leq b \leq 1$, $0 \leq a+b \leq 1$). InN has a greater lattice constant than GaN and the lattice constant of the first to third well layers Q1, Q2 and Q3 increases as the content of In contained in the first to third well layers Q1, Q2 and Q3 increases, causing an increased lattice constant difference between the first to third well layers Q1, Q2 and Q3 and the first to third barrier layers B1, B2 and B3. This may greatly increase interlayer stain and consequently, increase polarization, resulting in a reinforced interior electric field. Accordingly, since a triangular potential well may be generated as the energy band is bent by the electric field and electrons or holes may be concentrated on the triangular potential well, the re-coupling efficiency of electrons and holes may be deteriorated.

The polarization may be piezoelectric polarization caused by stress due to orientation and the lattice constant difference between the first to third well layers Q1, Q2 and Q3 and the first to third barrier layers B1, B2 and B3.

More specifically, the constituent semiconductor materials of the first to third well layers Q1, Q2 and Q3 and the first to third barrier layers B1, B2 and B3 have high piezoelectric coefficients and therefore, may cause excessively great polarization even by low strain. A static electric field caused by two polarizations may change the energy band gap of the quantum well structure, causing distortion in the distribution of electrons and holes. This is referred to as Quantum Confined Stark Effect (QCSE) and may deteriorate interior quantum efficiency of light emitting devices which emit light via the re-coupling of electrons and holes and may have a negative effect on electric and optical properties of light emitting devices, such as a red shift emission spectrum and the like.

In some embodiments, as the content of the third well layer Q3 decreases and thus, the lattice content thereof decreases, the lattice constant difference between the first to third barrier layers B1, B2 and B3 and the first to third well layers Q1, Q2 and Q3 may decrease. Accordingly, generation of the above described triangular potential well may be reduced and the re-coupling of electrons and holes may be increased, whereby the light emission efficiency of the light emitting device 100 may be enhanced.

Moreover, as the third well layer Q3 adjacent to the second semiconductor layer 126 has a great energy band gap and thus, has a high potential barrier, the third well layer Q3 may exhibit low resistance against holes injected from the second semiconductor layer 126, thereby achieving hole path diffusion. The hole path diffusion may allow electrons and holes to be re-coupled in a further increased area of the first active layer 124, which may enhance the re-coupling efficiency of electrons and holes and consequently, may enhance the light emission efficiency of the light emitting device 100.

The third well layer Q3 of the first active layer 124 having a great energy band gap may intercept propagation of crystallization defects and therefore, may improve crystallization defects of the second semiconductor layer 126, which may enhance the light emission efficiency of the light emitting device 100.

As illustrated in FIG. 7, the band gaps of the first to third well layers Q1, Q2 and Q3 may be increased in sequence.

More specifically, the content of In in the first to third well layers Q1, Q2 and Q3 may be reduced in sequence from the first well layer Q1 to the third well layer Q3.

As the energy band gap of the first to third well layers Q1, Q2 and Q3 increases with decreasing distance to the second semiconductor layer 126 which injects holes, it may be possible to enhance the hole injection efficiency of the first to third well layers Q1, Q2 and Q3 and to enhance the light emission efficiency of the light emitting device 100.

The thickness and energy band gap of the first to third well layers Q1, Q2 and Q3 of the first active layer 124 may be different from the thickness and energy band gap of the first to third well layers (not shown) of the second active layer 134, although the disclosure is not limited thereto.

For example, the energy level equation of light emitted in the well layers is as follows;

$$E_n = \frac{n^2 \hbar^2 \pi^2}{2mL^2}$$

In this case, "L" corresponds to thicknesses d1 and d2 of the well layers. Accordingly, the thicker the first to third well layers Q1, Q2 and Q3, the lower the energy level of light emitted from the first to third well layers Q1, Q2 and Q3.

As the first to third wall layers Q1, Q2 and Q3 of the first active layer 124 have different thicknesses from the first to third well layers (not shown) of the second active layer 134, the first and second sections 120 and 130 may emit different wavelength of light.

For example, the first section 120 may emit blue light and the second section 130 may emit green light, whereby the light emitting device 100 may emit light of multiple colors and may also emit white light via overlap of light of multiple colors without using a separate photo catalyst, such as a fluorescent substance (not shown).

Figure 8:
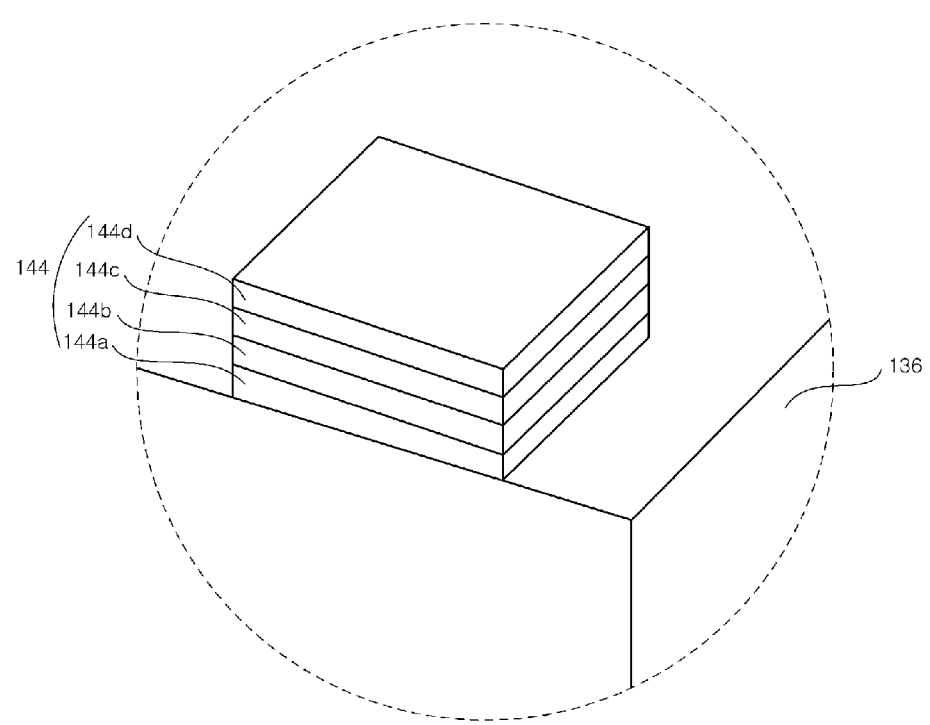
FIG. 8 is an enlarged perspective view showing the cross section of a P2 block with respect to a second electrode of the light emitting device shown in FIG. 2.

FIG. 8 is an enlarged perspective view showing the cross section of a P2 block with respect to the second electrode of the light emitting device shown in FIG. 2.

Although FIG. 8 illustrates the second electrode 144, the first and third electrodes 142 and 146 may have the same configuration as the second electrode 144, and any one of the first and third electrodes 142 and 146 may have a different configuration from the second electrode 144, although the disclosure is not limited thereto.

In FIG. 8, the first to third electrodes 142, 144 and 146 are illustrated as having the same multilayer form.

The second electrode 144 may include an adhesive layer 144a, a reflective layer 144b, a protective layer 144c and a bonding layer 144d.

The reflective layer 144b may be formed of Ag and an Ag alloy.

As the reflective layer 144b contains Ag having high reflectivity, it may be possible to increase the reflectivity of the second electrode 144, which may enhance the light emission efficiency of the light emitting device 100. As the reflective layer 144b is formed of an Ag alloy, it may be possible to prevent, e.g., a voltage upon thermal treatment of the second electrode 144 and galvanic corrosion due to contact potential difference and the like.

For example, in the case in which the fourth semiconductor layer 136 is an n-type semiconductor layer, it may be difficult to achieve an ohmic contact between the second electrode 144 and the fourth semiconductor layer 136 if the reflective layer 144b is formed of Ag. However, if the reflective layer 146b is formed of an Ag alloy, it may be possible to achieve an ohmic contact as well as high reflectivity owing to the presence of Ag.

The Ag alloy may contain Ag and at least one of Cu, Re, Bi, Al, Zn, W, Sn, In and Ni, although the disclosure is not limited thereto. The Ag alloy may be formed by performing alloying treatment at a temperature of 100° C. to 700° C.

The fourth semiconductor layer 136 may contain Ag of wt % or more, although the disclosure is not limited thereto.

The adhesive layer 144a may be formed of at least one of Cr, Ti, V, Ta and Al, and may serve not only to enhance adhesion between the second electrode 144 and the fourth semiconductor layer 136, but also to restrict excessive diffusion and movement of Ag contained in the reflective layer 144b during thermal treatment.

The protective layer 144c may be formed of at least one of Cr, Ti, Ni, Pd, Pt, W, Co and Cu, and may serve to restrict excessive introduction of oxygen from the outside and excessive diffusion of Ag particles to the outside, thereby preventing agglomeration and cavitation of Ag.

The adhesive layer 144a, the reflective layer 144b and the protective layer 144c may be sequentially deposited or may be formed at the same time, although the disclosure is not limited thereto.

Alternatively, the adhesive layer 144a and the reflective layer 144b may be sequentially deposited or may be formed at the same time, although the disclosure is not limited thereto.

In the case in which the adhesive layer 144a and the reflective layer 144b are alloyed, they may form a single layer having a composition of $Ag_xM_yA_z$ (1≥x≥0.5).

When performing thermal treatment on the second electrode 144 having the above described configuration, the second electrode 144 may be bonded to the fourth semiconductor layer 136 with low contact resistance and strong adhesive force.

Since the thermally treated second electrode 144 is free from galvanic corrosion and the adhesive layer 144a and the protective layer 144c may prevent diffusion of Ag particles due to thermal treatment, the second electrode 144 may maintain excellent reflectivity owing to the presence of Ag.

When the light emitting device 100 is mounted in the light emitting device package (not shown), the bonding layer 144d may be bonded to a wire (not shown) or a lead frame (not shown) which is connected to apply power from an external source. For example, the bonding layer 146d may be formed of Au and an Au alloy, although the disclosure is not limited thereto.

FIGS. 9 to 18 are perspective views showing embodiments of various configurations of the light emitting device shown in FIG. 1.

Figure 9:
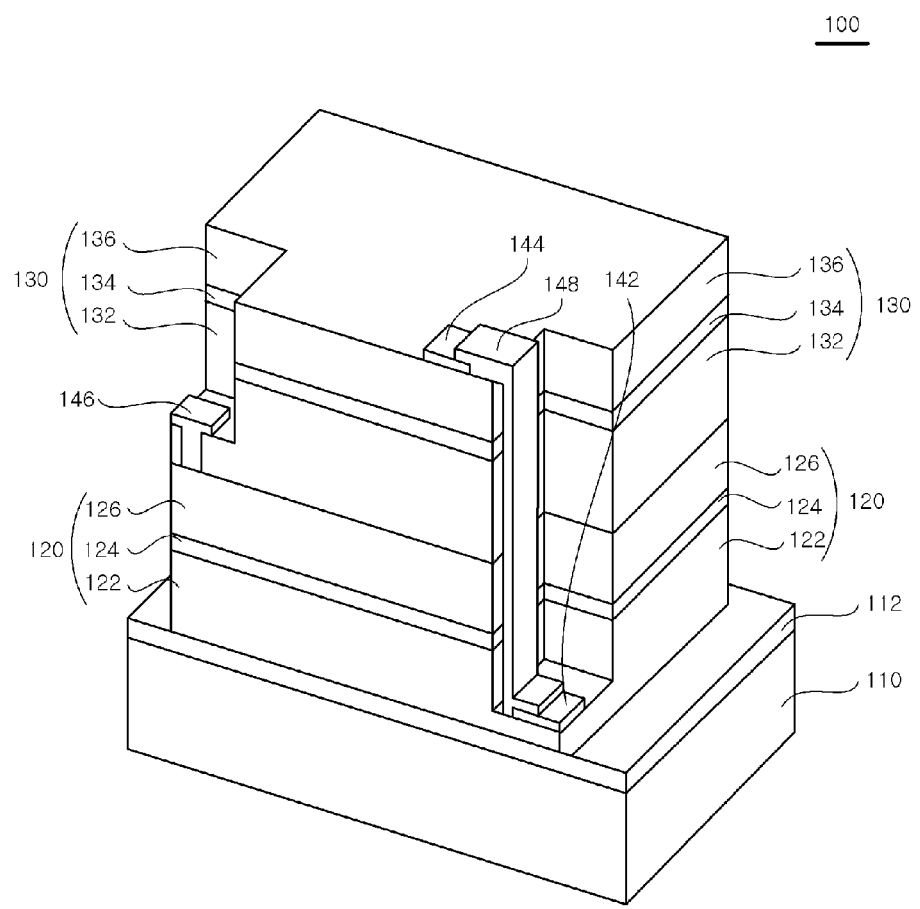
FIGS. 9 to 18 are perspective views showing embodiments of various configurations of the light emitting device shown in FIG. 1.
Figure 10:
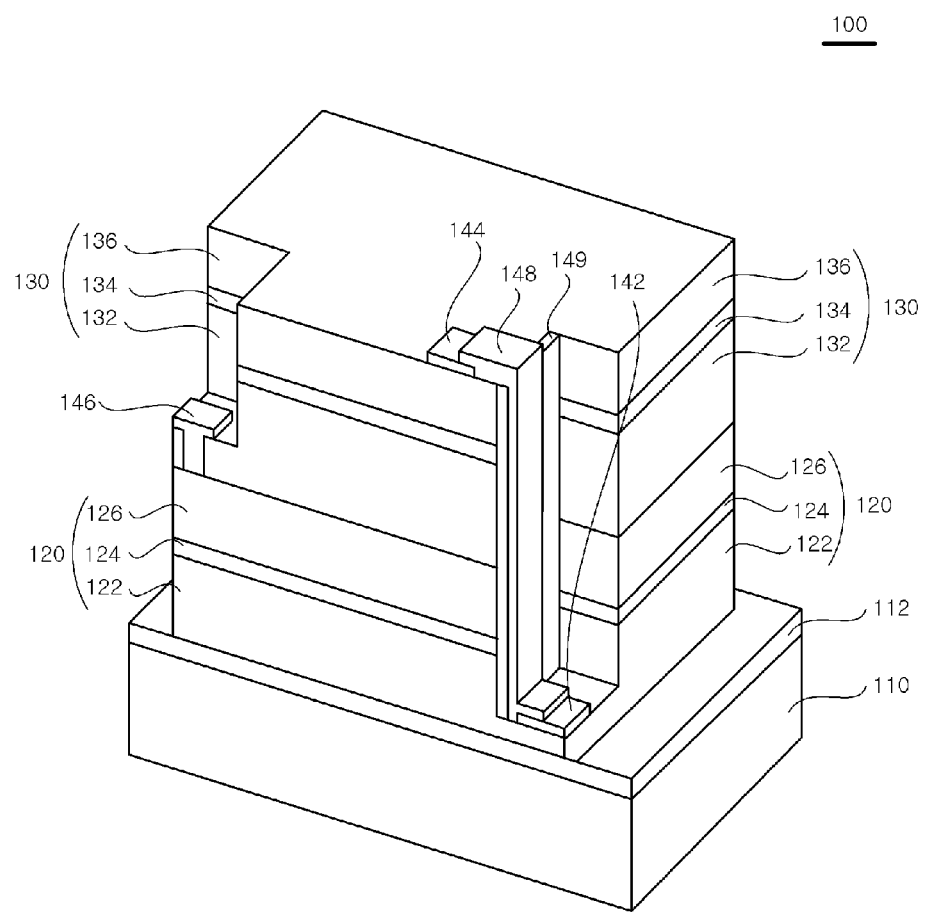

FIGS. 9 and 10 illustrate the embodiments with regard to the first and second electrodes 142 and 144 of the light emitting device 100 shown in FIGS. 1 and 2.

Specifically, the light emitting device 100 shown in FIGS. 9 and 10 may include a connecting electrode 148 to electrically connect the first and second electrodes 142 and 144 to each other.

First, referring to FIG. 9, the connecting electrode 148, which is used to electrically connect the first and second electrodes 142 and 144 to each other, may be disposed at a distance from the lateral surface of the first and second sections 120 and 130 of the light emitting device 100.

Although the embodiment illustrates the connecting electrode 148 as a separate electrode, the connecting electrode 148 may be an extension of any one of the first and second electrodes 142 and 144, although the disclosure is not limited thereto.

In this case, the connecting electrode 148 may be spaced apart from the lateral surface of the first and second sections 120 and 130 by a distance of 1 μm or more, which may reduce the risk of short circuit with the first and second sections 120 and 130.

The light emitting device 100 shown in FIG. 10 may include a protective layer 149 between the connecting electrode 148 and the lateral surface of the first and second sections 120 and 130.

As described above in relation to FIG. 9, the protective layer 149 may prevent short circuit between the connecting electrode 148 and the first and second sections 120 and 130 and may maintain superior stability than the light emitting device 100 shown in FIG. 9.

The protective layer 149 may be formed of an electrically insulating material, for example, any one selected from among $SiO_2$, $SiO_x$, $SiO_xN_y$, $Si_3N_4$, $Al_2O_3$, $TiO_x$, $TiO_2$, Ti, Al and Cr, although the disclosure is not limited thereto.

Figure 11:
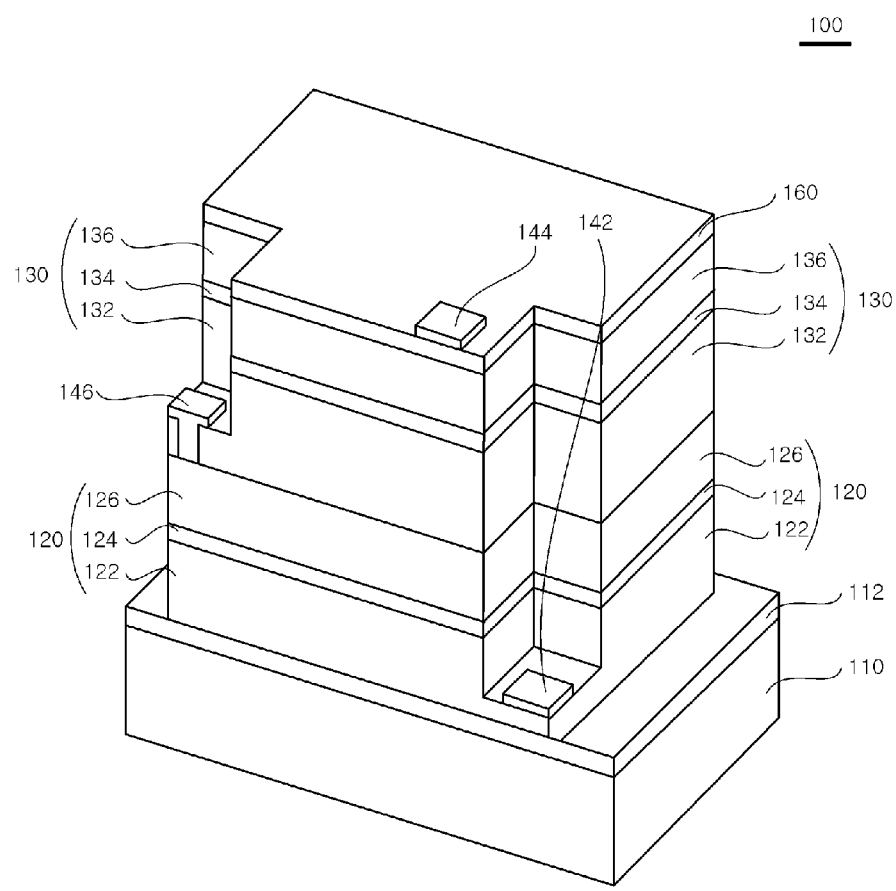
Figure 12:
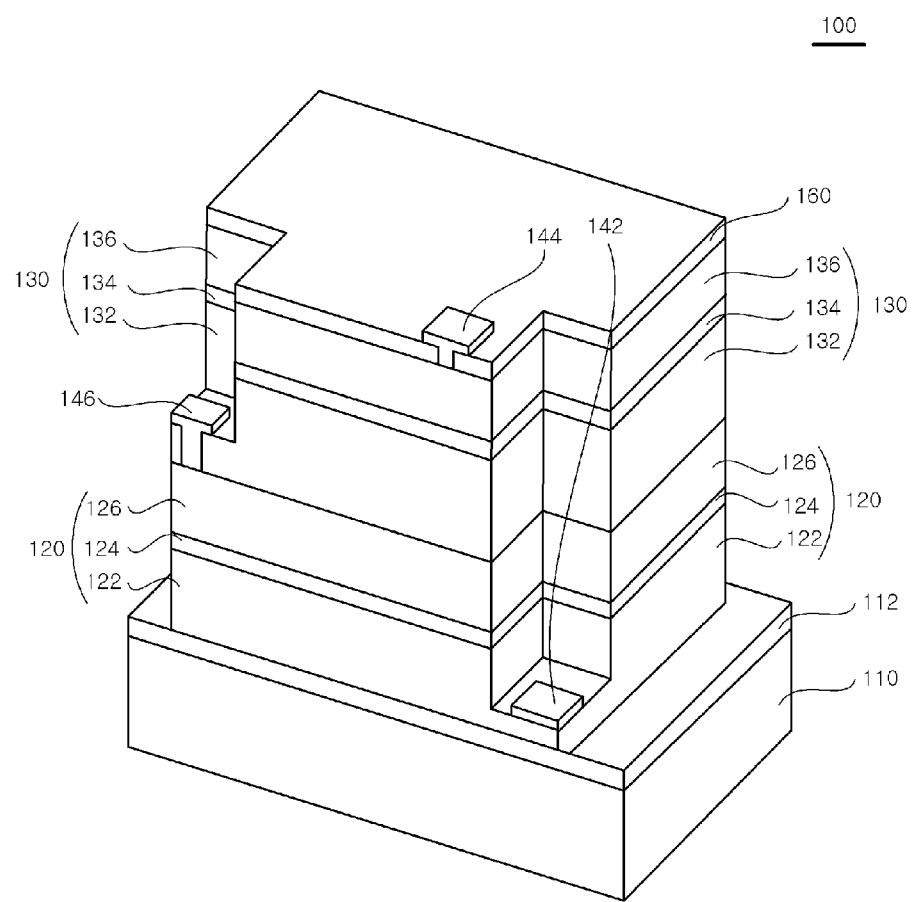
Figure 13:
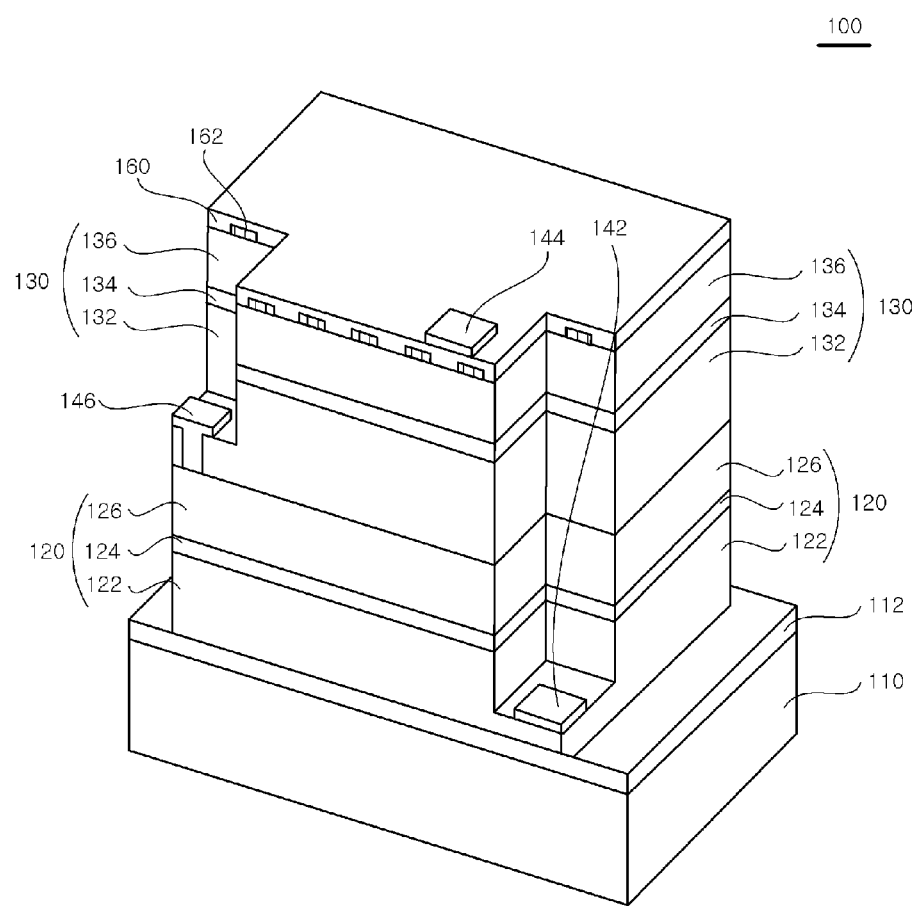

The light emitting device 100 shown in FIGS. 11 to 13 may include a light transmissive electrode layer 160 on the second section 130 of the light emitting device 100 shown in FIGS. 1 and 2.

First, referring to FIG. 11, the light emitting device 100 may include the light transmissive electrode layer 160 between the fourth semiconductor layer 136 of the second section 130 and the second electrode 144.

In this case, the light transmissive electrode layer 160 may improve spreading of current applied to the second electrode 144, thereby ensuring easy diffusion of current to the fourth semiconductor layer 136.

The light transmissive electrode layer 160 may be formed of a light transmissive conductive material, such as IZO, IZTO, IAZO, IGZO, IGTO, AZO, ATO or the like, although the disclosure is not limited thereto.

Referring to FIG. 12, the light transmissive electrode layer 160 may have a hole (not shown) at a position thereof corresponding to the second electrode 144.

Specifically, the second electrode 144 may be disposed on a surface of the light transmissive electrode layer 160 and on and in a surface of the fourth semiconductor layer 136 that is exposed through the hole perforated in the light transmissive electrode layer 160.

The second electrode 144 may have a high work function via Schorttky contact with the fourth semiconductor layer 136.

Accordingly, the light transmissive electrode layer 160 prevents current applied through the second electrode 144 from being concentrated on the fourth semiconductor layer 136 coming into contact with the second electrode 144 and allows the current to flow through the light transmissive electrode layer 160, thereby achieving improved current spreading.

Referring to FIG. 13, the light emitting device 100 may include the light transmissive electrode layer 160 and a first current limiting layer 162 included in the light transmissive electrode layer 160.

The light transmissive electrode 160 has been described with reference to FIGS. 11 and 12 and thus, a description thereof will be omitted.

The first current limiting layer 162 may be disposed between the fourth semiconductor layer 136 and the second electrode 144 and may be disposed in the light transmissive electrode layer 160, although the disclosure is not limited thereto.

The first current limiting layer 162 may be formed of the same material as the light transmissive electrode layer 160, or may be formed of a light transmissive insulating material, although the disclosure is not limited thereto.

The first current limiting layer 162 may be formed of at least one selected from among $Si_3N_4$, $TiO_x$, $TiO_2$, Ti, Al, Cr, $Al_2O_3$, $SiO_2$, IZO, IZTO, IAZO, IGZO, IGTO, AZO and ATO.

The first current limiting layer 162 may include a plurality of light transmissive structures arranged on the fourth semiconductor layer 136.

For example, the first current limiting layer 162 may be formed by distributing a plurality of particles having a predetermined size over the fourth semiconductor layer 136 or by disposing a layer having a predetermined thickness and roughness on the fourth semiconductor layer 136, and may be arranged to have a predetermined pattern or be randomly distributed, although the disclosure is not limited thereto.

The first current limiting layer 162, which is formed of the insulating material, may prevent current crowding at the bottom of the second electrode 144.

In this case, the first current limiting layer 162 may define a pattern on an upper surface of the light transmissive electrode layer 160, although the disclosure is not limited thereto.

The light emitting device 100 shown in FIGS. 14 to 17 may include an intermediate layer 150 between the first and second sections 120 and 130 of the light emitting device 100 shown in FIGS. 1 and 2.

Figure 14:
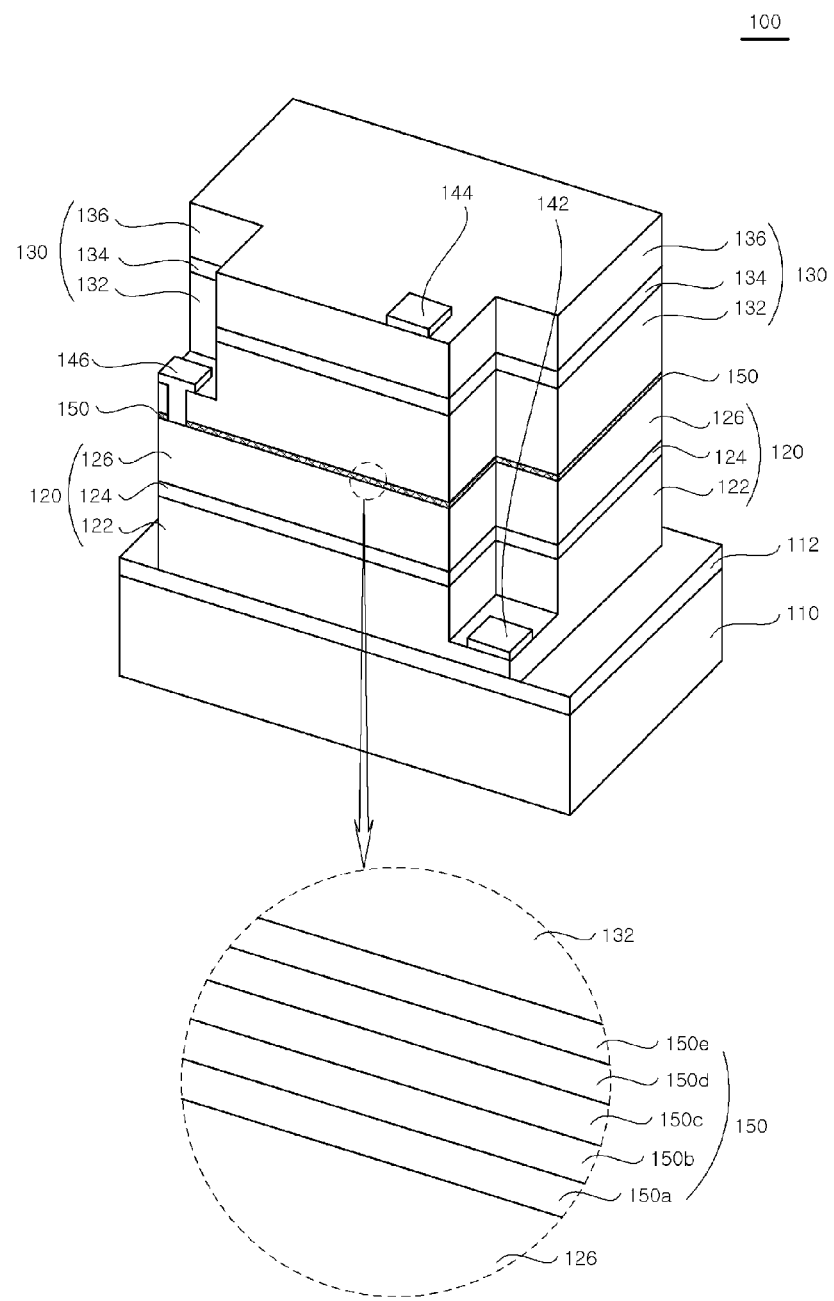

Referring to FIG. 14, the light emitting device 100 may include the intermediate layer 150, which is interposed between the first and second sections 120 and 130 and is formed of a light transmissive insulating material.

The intermediate layer 150 may have a predetermined thickness and may serve to separate the first and second sections 120 and 130 from each other. A part of the intermediate layer 150 may be removed to allow the third electrode 146 to come into contact with the second semiconductor layer 126.

Specifically, the intermediate layer 150 may be, for example, an undoped semiconductor layer. In this case, the intermediate layer 150 is not doped with a p-type dopant or an n-type dopant and thus, may have very low conductivity to achieve insulation properties equal to an insulating material, although the disclosure is not limited thereto. In other embodiments, the intermediate layer 150 may include silicon dioxide ($SiO_2$) doped with at least one of a p-type dopant or an n-type dopant.

The intermediate layer 150 may have a multilayer form comprising a plurality of layers 150a to 150e as shown in FIG. 14, or may include at least one layer, although the disclosure is not limited thereto.

At least two layers among the plurality of layers 150a to 150e may have different energy band gaps and different indices of refraction, and the plurality of layers 150a to 150e having different energy band gaps may be alternately and repeatedly stacked one above another, although the disclosure is not limited thereto.

The plurality of layers 150a to 150e, for example, may include semiconductor layers containing GaN, InN, InGaN, AlGaN, ZnO, AlO, AlZnO, InZnO, InO, InAlZnO or AlInO. The plurality of layers 150a to 150e may be arranged in such a way that the layer having the smallest energy band gap and the layer having the greatest energy band gap come into contact with each other.

The intermediate layer 150 may have the same composition and configuration as at least one of the first to fourth semiconductor layers 122, 126, 132 and 136 and the first and second active layers 122 and 124 included in the first and second sections 120 and 130, except that it is not doped with a dopant, although the disclosure is not limited thereto.

Specifically, the intermediate layer 150 interposed between the first section 120 and the second section 130 may prevent current leaked from the first and second sections 120 and 130 from being diffused to other regions, which may prevent damage to the first and second sections 120 and 130 due to the leaked current.

A thickness of the intermediate layer 150 may be in a range of 0.01 μm to 2 μm. If the thickness is less than 0.01 μm, the intermediate layer 150 may have poor insulation properties. If the thickness is greater than 2 μm, this may cause deterioration of light emission efficiency.

Figure 15:
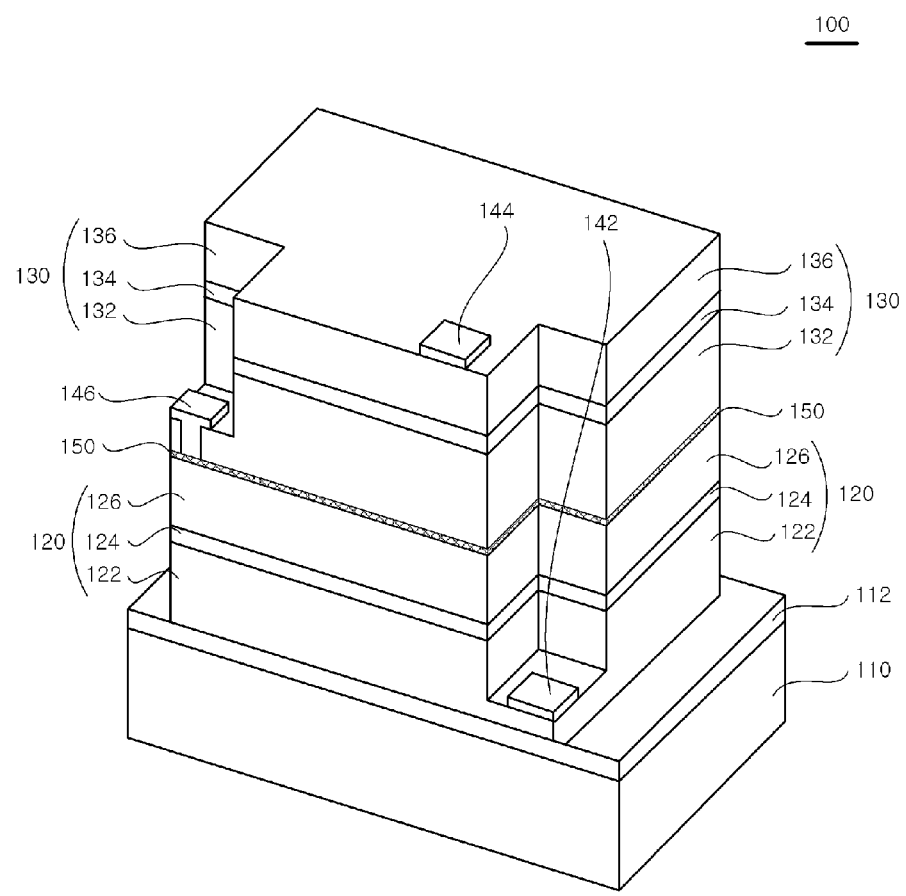

Referring to FIG. 15, the light emitting device 100 may exhibit conductivity and transmittance and may include the intermediate layer 150 between the first and second sections 120 and 130.

Specifically, the intermediate layer 150, for example, may be formed of an oxide based material, such as ZnO, MgO and $TiO_2$, or may be formed of silicon doped with at least one of n-type and p-type dopants, although the disclosure is not limited thereto.

The intermediate layer 150 may have a single layer or multi-layer configuration or may have a predetermined pattern, although the disclosure is not limited thereto.

The intermediate layer 150 may serve to diffuse current fed from the third electrode 146 so as to apply the current to the second and third semiconductor layers 126 and 132, which may improve current spreading and consequently, light emitting efficiency.

The thickness of the intermediate layer 150 may be in a range of 0.01 μm to 2 μm. If the thickness is less than 0.01 μm, current spreading may be insufficient. If the thickness is greater than 2 μm, this may cause deterioration of light emission efficiency.

The intermediate layer 150 may be grown under a low temperature atmosphere and for example, may be formed of a material selected from among GaN, InN, AlN, AlInN, InGaN, AlGaN and InAlGaN, although the disclosure is not limited thereto.

Specifically, the intermediate layer 150, for example, may be formed of a semiconductor material having a composition of $In_xAl_yGa_{1-x-y}N$ ($0 \leq x \leq 1$, $0 \leq y \leq 1$, $0 \leq x+y \leq 1$). The intermediate layer 150 my have a greater energy band gap than the second and third semiconductor layers 126 and 132.

The intermediate layer 150, for example, may contain a greater amount of Al than the second and third semiconductor layers 126 and 132. In one example, the intermediate layer 150 may have a composition of $In_xAl_{y1}Ga_{1-x-y}N$ ($0 \leq x \leq 1$, $0 \leq y \leq 1$, $0 \leq x+y \leq 1$), the second semiconductor layer 126 may have a composition of $In_xAl_{y2}Ga_{1-x-y2}N$ ($0 \leq x \leq 1$, $0 \leq y \leq 1$, $0 \leq x+y \leq 1$) and the third semiconductor layer 132 may have a composition of $In_xAl_{y3}Ga_{1-x-y3}N$ ($0 \leq x \leq 1$, $0 \leq y \leq 1$, $0 \leq x+y \leq 1$), y1 being greater than y2 and y3.

For example, y1 may be in a range of 0.2 to 0.5. In this case, y2 and y3 may be less than 0.2, although the disclosure is not limited thereto.

That is, the content of Al in the intermediate layer 150 may be in a range of 2 to 5 times the content of Al in at least one of the second and third semiconductor layers 126 and 132.

Figure 16:
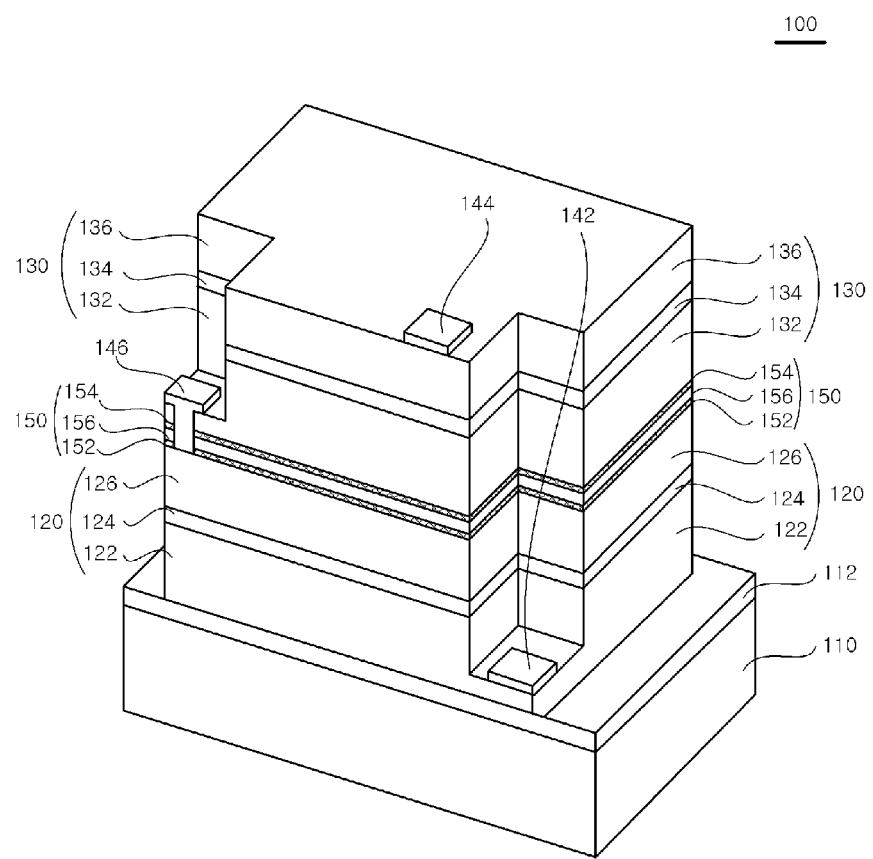

Referring to FIG. 16, the light emitting device 100 may include a first intermediate layer 152 adjacent to the first section 120, a second intermediate layer 154 adjacent to the second section 130, and a third intermediate layer 156 between the first and second intermediate layers 152 and 154.

At least one of the first to third intermediate layers 152, 154 and 156 may have a dual layer configuration, although the disclosure is not limited thereto.

The first and second intermediate layers 152 and 154 may be 2-dimensional electron gas layers formed by an energy band gap difference between the second and third semiconductor layers 126 and 132 and the intermediate layer 150.

Figure 17:
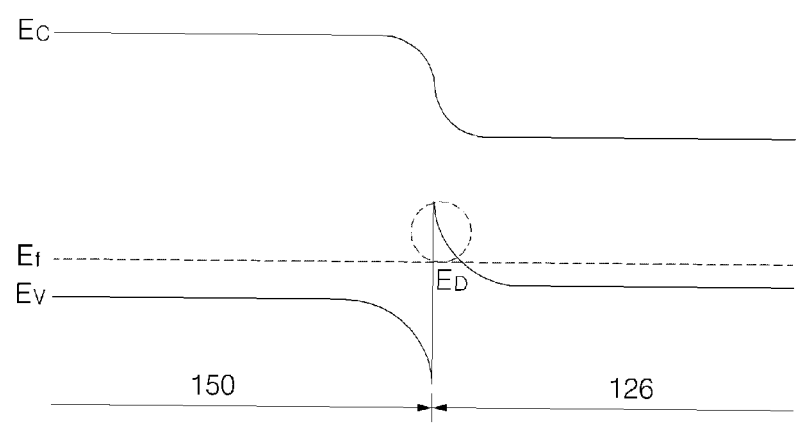

FIG. 17 is a diagram showing an energy band gap between the second and third semiconductor layers 126 and 132 and the intermediate layer 150 shown in FIG. 16.

Referring to FIGS. 16 and 17, when the intermediate layer 150 having a different energy band gap is disposed between the second and third semiconductor layers 126 and 132, band offset occurs in a region where the intermediate layer 150 comes into contact with the second and third semiconductor layers 126 and 132 in order to maintain the balance of Fermi level EF.

Thereby, the first intermediate layer 152 and the second intermediate layer 154, which have a band offset region ED, may be formed on the region where the intermediate layer 150 comes into contact with the second and third semiconductor layers 126 and 132.

The first and second intermediate layers 152 and 154 are provided with the band offset region ED, thereby forming 2-dimensional electron gas layers on which electrons are concentrated. As such, the first and second intermediate layers 152 and 154 may have higher movability of electrons and thus, lower resistance than the third intermediate layer 156 and the second and third semiconductor layers 126 and 132.

The first and second intermediate layers 152 and 154 may exhibit easy passage of current fed from the third electrode 146, thereby improving current spreading.

In other words, the first and second intermediate layers 152 and 154, as illustrated in FIG. 15, may have conductivity.

Figure 18:
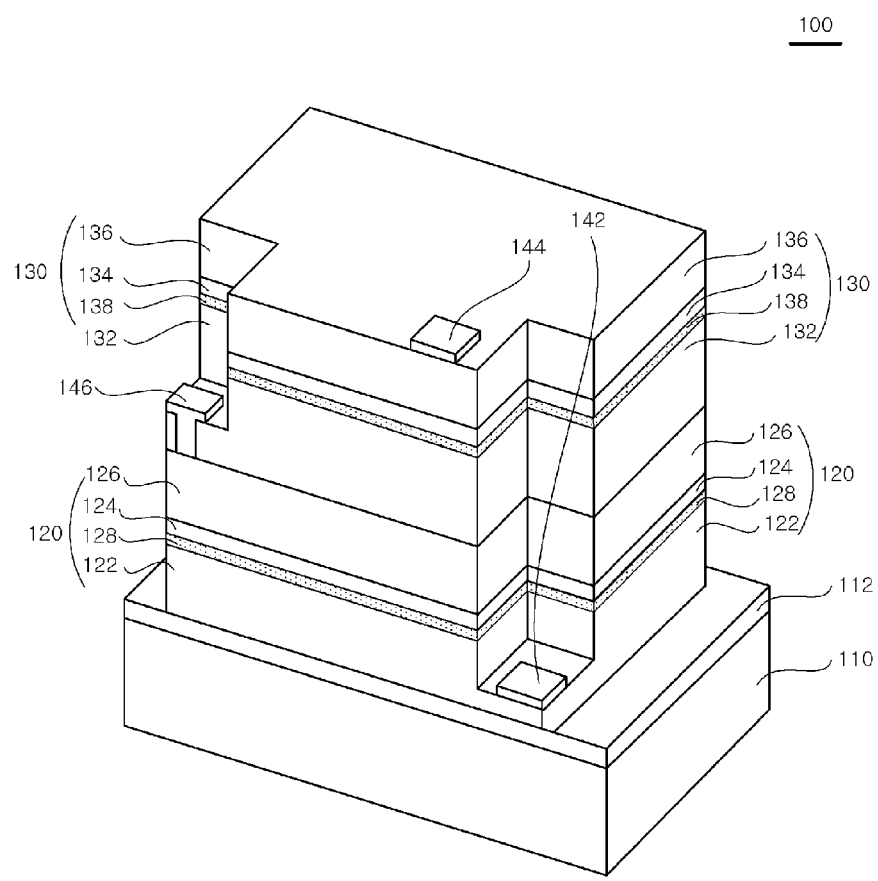

The light emitting device 100 shown in FIG. 18 may include first and second electron blocking layers 128 and 138 adjacent respectively to the first and second active layers 124 and 134 of the light emitting device 100 shown in FIGS. 1 and 2.

Referring to FIG. 18, the first and second electron blocking layers 128 and 138 may have a greater energy band gap than the first and second active layers 124 and 134 and may serve to prevent electrons injected from the first and third semiconductor layers 122 and 132 from being injected into the second and fourth semiconductor layers 126 and 136, rather than being re-coupled in the first and second active layers 124 and 134.

That is, the first and second electron blocking layers 128 and 138 may enhance re-coupling possibility of electrons and holes in the first and second active layers 124 and 134 and may prevent current leakage.

The first and second electron blocking layers 128 and 138 may have a greater energy band gap than the barrier layers included in the first and second active layers 124 and 134. For example, the first and second electron blocking layers 128 and 138 may be semiconductor layers containing Al, such as p-type AlGaN, although the disclosure is not limited thereto.

Although the first and second electron blocking layers 128 and 138 shown in FIG. 18 are illustrated as being disposed on lower surfaces of the first and second active layers 124 and 134, the first and second electron blocking layers 128 and 138 may be disposed on upper surfaces of the first and second active layers 124 and 134, although the disclosure is not limited thereto.

Figure 19:
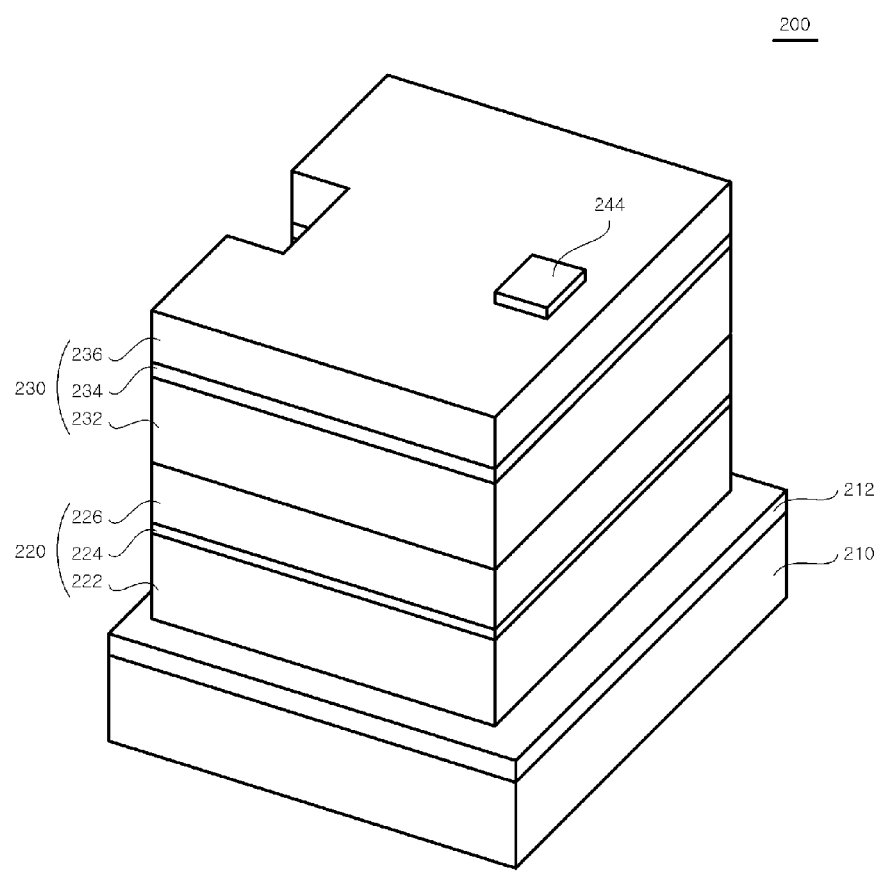
FIG. 19 is a perspective view showing a light emitting device in accordance with a second embodiment.
Figure 20:
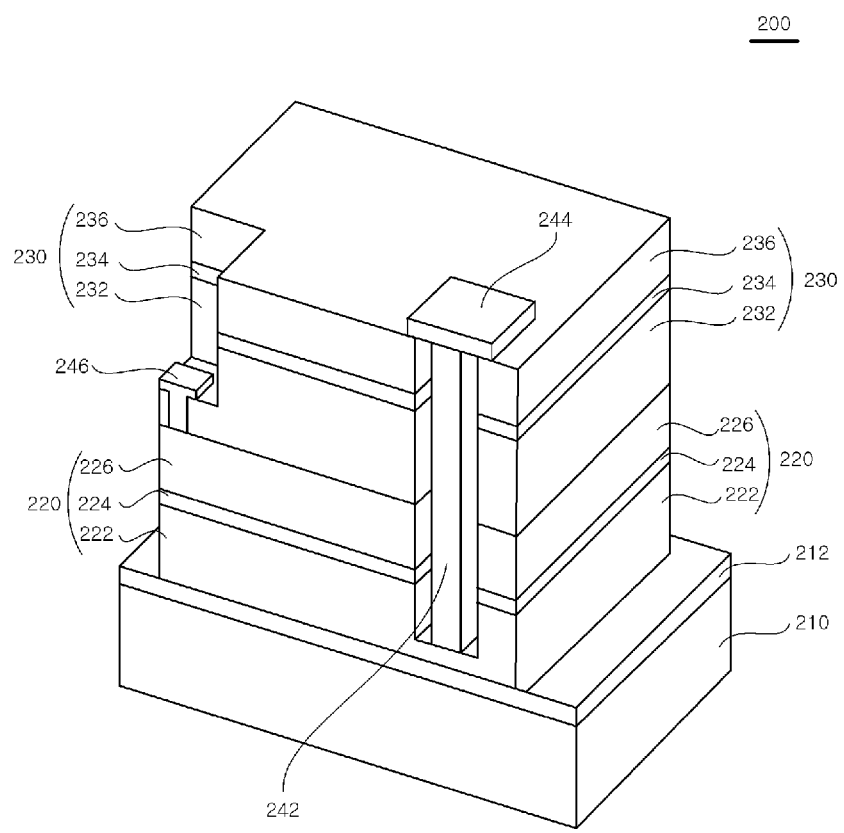
FIG. 20 is a perspective view showing a first alternative embodiment with respect to a cutting plane of the light emitting device shown in FIG. 19.
Figure 21:
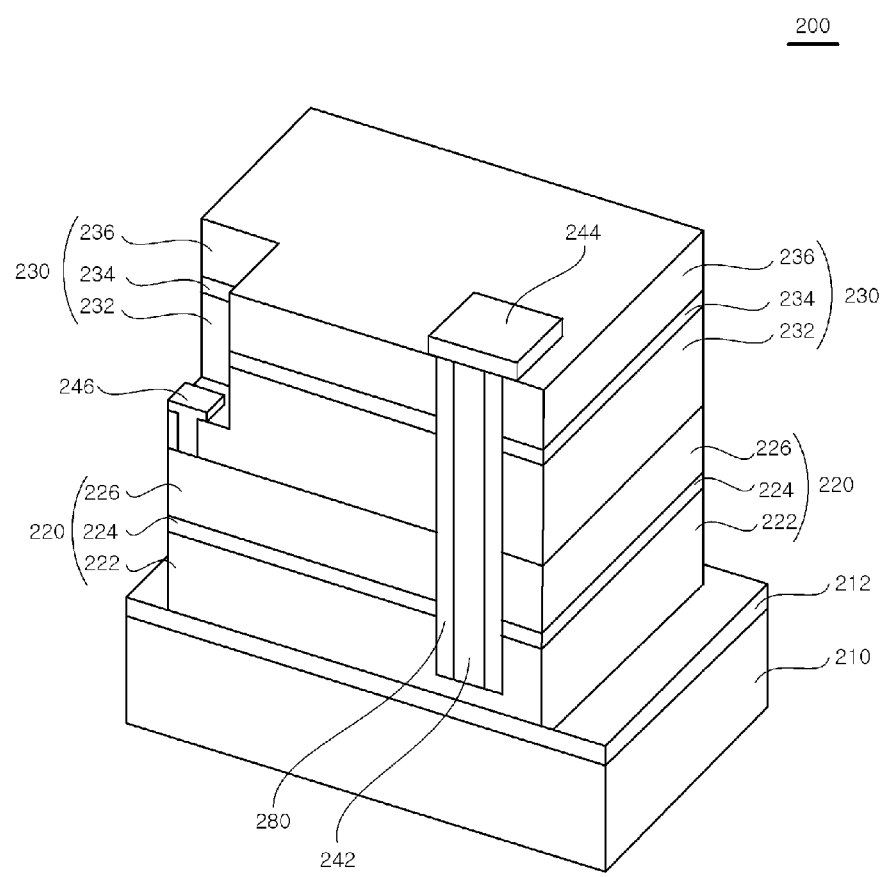
FIG. 21 is a perspective view showing a second alternative embodiment with respect to the cutting plane of the light emitting device shown in FIG. 19.

FIG. 19 is a perspective view showing a light emitting device in accordance with a second embodiment, FIG. 20 is a perspective view showing a first alternative embodiment with respect to a cutting plane of the light emitting device shown in FIG. 19, and FIG. 21 is a perspective view showing a second alternative embodiment with respect to the cutting plane of the light emitting device shown in FIG. 19.

In FIGS. 19 to 21, the configurations illustrated in FIGS. 1 and 2 are briefly illustrated or omitted.

Referring to FIGS. 19 and 20, the light emitting device 200 may include a support member 210 and a light emitting structure (not shown) disposed on the support member 210. The light emitting structure may include a first section 220 and a second section 230 disposed on the first section 220. The first section 220 comprises a buffer layer 212, a first semiconductor layer 222 and a second semiconductor layer 226 sequentially disposed on the buffer layer 212 and a first active layer 224 between the first and second semiconductor layers 222 and 226. The second section 230 comprises a third semiconductor layer 232, a fourth semiconductor layer 236 and a second active layer 234 between the third and fourth semiconductor layers 232 and 236.

A description of the support member 210, the buffer layer 212 and the light emitting structure will be omitted in FIGS. 1 and 2 and only a difference from FIGS. 1 and 2 will be described.

The light emitting structure may have a first trench (not shown) formed from the fourth semiconductor layer 236 to the first semiconductor layer 222 so as to expose a part of the first semiconductor layer 222.

The first trench may have at least one shape selected from among a polygonal shape, a semicircular shape, a circular shape and a curved edge shape when viewed from the top, although the disclosure is not limited thereto.

Although the embodiment illustrates the first trench as being formed into the first semiconductor layer 222, the first trench may be formed onto a surface of the first semiconductor layer 222 from which the first active layer 224 has been removed, although the disclosure is not limited thereto.

In this case, a first electrode 242 may be disposed on an exposed region of the first semiconductor layer 222 within the first trench.

In this case, the first electrode 242 may have a depth equal to or greater than that of the first trench, although the disclosure is not limited thereto.

As the first electrode 242 is spaced apart from an inner lateral surface of the first trench, the first electrode 242 may gave a smaller width than the first trench.

A second electrode 244 may be disposed on the fourth semiconductor layer 236 to cover the first trench.

Although the embodiment illustrates the second electrode 244 as covering the first trench, the second electrode 244 may be disposed on the fourth semiconductor layer 236 so as not to overlap with the first trench, or may partially overlap with the first trench, although the disclosure is not limited thereto.

The second electrode 244 may be electrically connected to the first electrode 242 and may have a width equal to or greater than the first electrode 242, although the disclosure is not limited thereto.

The third electrode 246 is inserted into a hole (not shown) formed in the exposed region of the third semiconductor layer 232. As a part of the third electrode 246 is disposed on the exposed region of the third semiconductor layer 232 and the other part of the third electrode 246 is disposed on the second semiconductor layer 226, the second and third semiconductor layers 226 and 232 may be electrically connected to each other.

A depth of the hole may be in a range of 1 to 3 times a thickness of the exposed region of the third semiconductor layer 232 and a width of the hole may be in a range of 0.3 to 0.9 times a width of the exposed region, although the disclosure is not limited thereto.

The exposed region of the third semiconductor layer 232 may be etched in the same manner as a non-overlapping region of the above described first semiconductor layer 222, although the disclosure is not limited thereto.

Specifically, although the third electrode 246 is illustrated as being disposed on a surface of the second semiconductor layer 226, the third electrode 246 may be disposed in the second semiconductor layer 226.

In other words, the second semiconductor layer 226 may be provided with a recess (not shown) at a position corresponding to the hole, and the third electrode 246 may be accommodated in the recess so as to be electrically connected to an inner surface of the second semiconductor layer 226.

A width of the recess may be in a range of 0.5 to 1 times a width of the hole, although the disclosure is not limited thereto.

Referring to FIG. 21, a first insulating layer 280 may be disposed between the first electrode 242 and the inner lateral surface of the first trench.

The first insulating layer 280 comes into contact with the inner lateral surface of the first trench and the first electrode 242, thereby preventing short circuit of the light emitting structure and consequently, achieving enhanced reliability.

The first insulating layer 280 may be formed of a light transmissive insulating material, for example, silicon, epoxy and the like, although the disclosure is not limited thereto.

The first insulating layer 280 may be selectively disposed on a part of or all the inner lateral surface of the first trench, although the disclosure is not limited thereto.

Features described with reference to FIGS. 9 to 18 are applicable to the light emitting device 200 illustrated in the second embodiment and thus, a description thereof will be omitted.

Figure 22:
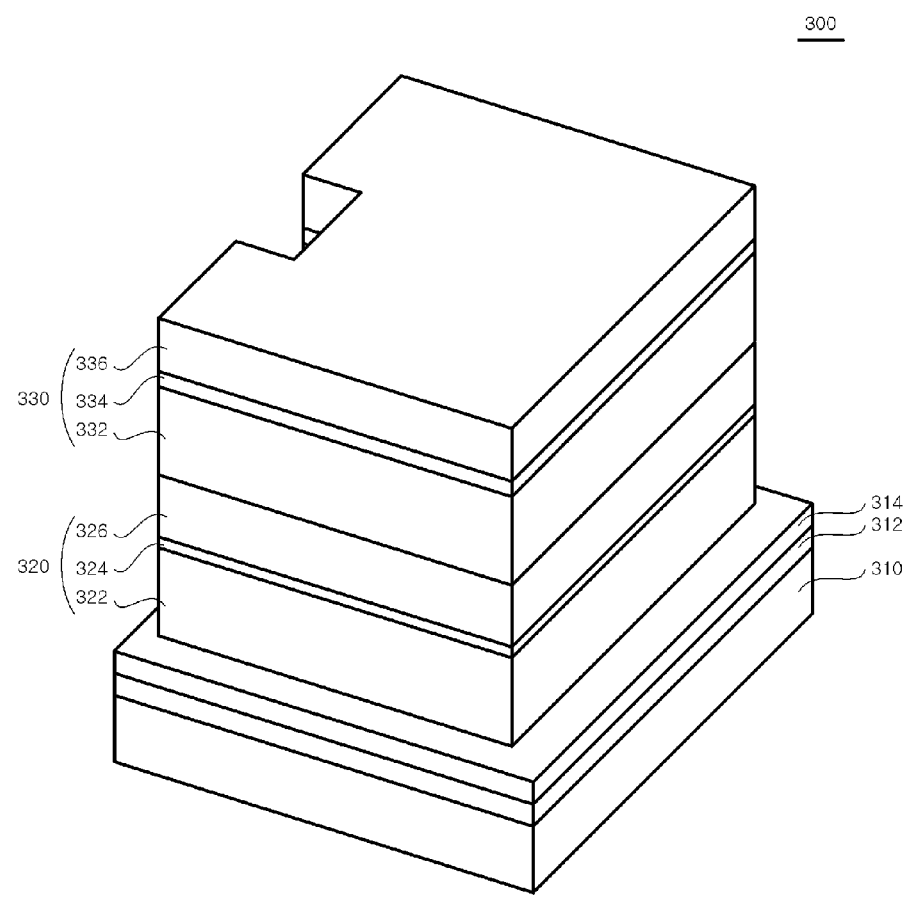
FIG. 22 is a perspective view showing a light emitting device in accordance with a third embodiment.
Figure 23:
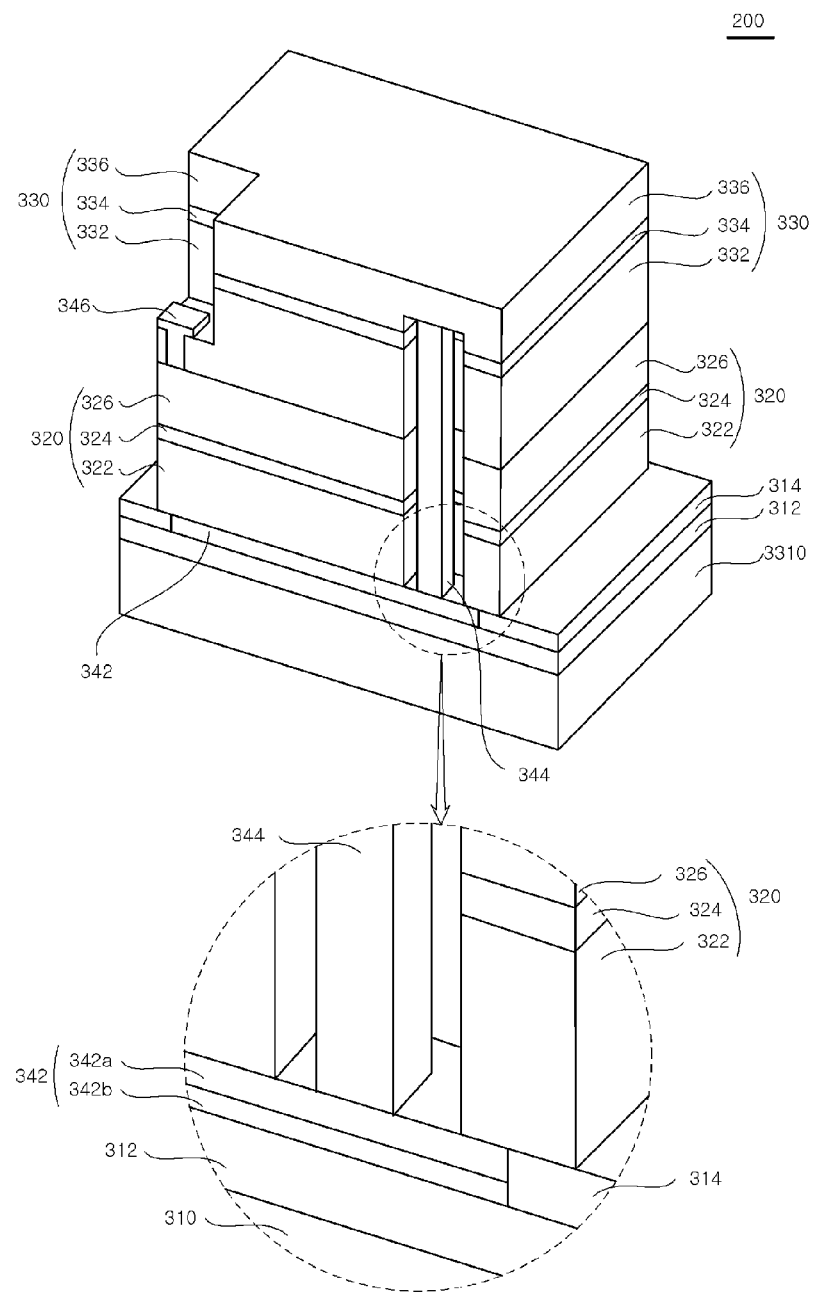
FIG. 23 is a perspective view showing a first alternative embodiment with respect to a cutting plane of the light emitting device shown in FIG. 22.
Figure 24:
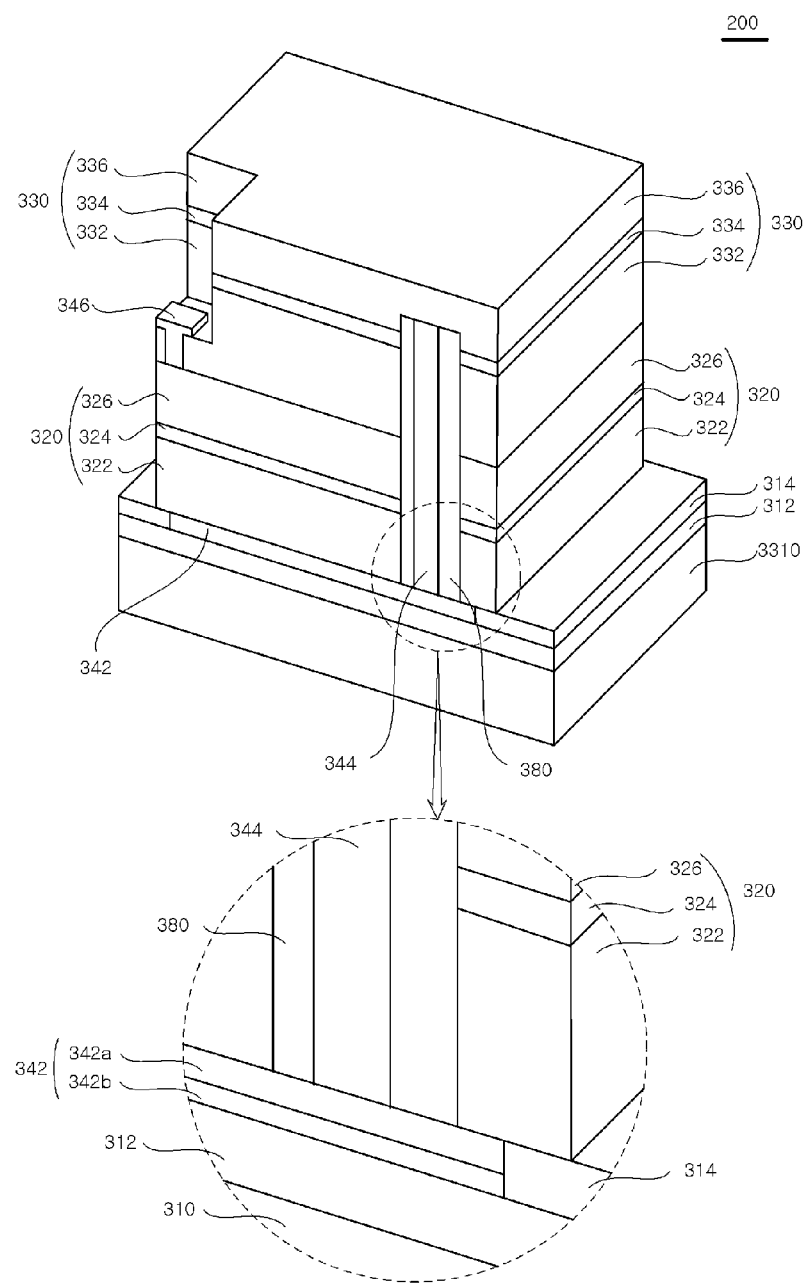
FIG. 24 is a perspective view showing a second alternative embodiment with respect to the cutting plane of the light emitting device shown in FIG. 22.

FIG. 22 is a perspective view showing a light emitting device in accordance with a third embodiment, FIG. 23 is a perspective view showing a first alternative embodiment with respect to a cutting plane of the light emitting device shown in FIG. 22, and FIG. 24 is a perspective view showing a second alternative embodiment with respect to the cutting plane of the light emitting device shown in FIG. 22.

In FIGS. 22 to 24, the configurations illustrated in FIGS. 1 and 2 are briefly illustrated or omitted.

Referring to FIGS. 22 to 24, the light emitting device 300 may include a support member 310 and a light emitting structure (not shown) disposed on the support member 310. The light emitting structure may include a first section 320 and a second section 330 disposed on the first section 320. The first section 320 comprises a first semiconductor layer 322, a second semiconductor layer 326 and a first active layer 324 between the first and second semiconductor layers 322 and 326. The second section 330 comprises a third semiconductor layer 332, a fourth semiconductor layer 336 and a second active layer 334 between the third and fourth semiconductor layers 332 and 336.

The support member 310 illustrated in the third embodiment may be a conductive support member, differently from the support members 110 and 210 of the light emitting devices 100 and 200 according to the first and second embodiments.

The support member 310 may be formed of a material having good thermal conductivity, i.e. a conductive material, such as a metal and conductive ceramic.

The support member 310 may have a single layer, a dual layer or a multilayer form.

Specifically, the support member 310 may be formed of a metal, for example, any one selected from among gold (Au), nickel (Ni), tungsten (W), molybdenum (Mo), copper (Cu), aluminum (Al), tantalum (Ta), silver (Ag), platinum (Pt) and chrome (Cr), or may be formed of two or more alloys. The support member 310 may be a stack of different two or more materials.

The support member 310 may facilitate radiation of heat from the light emitting device 300, thereby enhancing thermal stability of the light emitting device 300.

The support member 310 may be formed of a semiconductor material, for example, a carrier wafer, such as silicon (Si), germanium (Ge), gallium arsenide (GaAs), zinc oxide (ZnO), silicon carbide (SiC), silicon germanium (SiGe), gallium nitride (GaN) and gallium oxide ($Ga_2O_3$).

The support member 310 may exhibit light transmittance, for example, when it is formed of Si by a predetermined thickness or less, although the disclosure is not limited thereto.

The support member 310 may be formed of a material having high thermal conductivity. An index of refraction of the support member 310 may be less than that of the light emitting structure for the sake of light extraction efficiency.

To enhance light extraction efficiency, the support member 310 may be provided with a light extraction pattern (not shown), although the disclosure is not limited thereto.

The support member 310 may be formed using an electro chemical metal deposition method, a bonding method using an eutectic metal or the like.

A metal bonding layer 312 may be disposed on the support member 310 and may serve to minimize electro migration caused when atoms of the first electrode 142 are moved by an electric field during application of current. The metal bonding layer 312 may contain at least one of a metal having good adhesion with respect to a lower material and an adhesive.

An anti-diffusion layer (not shown) to prevent diffusion of current may be formed on the metal bonding layer 312, although the disclosure is not limited thereto.

The metal bonding layer 312 or the anti-diffusion layer, for example, may be formed of at least one metal selected from among copper (Cu), niob (Nb), tin (Sn), indium (In), scandium (Sc), tantalum (Ta), vanadium (V), silicon (Si), silver (Ag), gold (Au), zinc (Zn), antimony (Sb), aluminum (Al), germanium (Ge), hafnium (Hf), lanthanum (La), magnesium (Mg), manganese (Mn), nickel (Ni), palladium (Pd), tungsten (W), ruthenium (Ru), molybdenum (Mo), iridium (Ir), rhodium (Rh), zirconium (Zr) and titanium (Ti) or alloys thereof. Thus, the metal bonding layer 312 may have a single layer or multilayer form.

The light emitting structure may be disposed on the metal bonding layer 312. A description of the light emitting structure will be omitted because the light emitting structure has been described in detail with reference to FIGS. 1 and 2.

A first electrode 342 may be disposed between the metal bonding layer 312 and the light emitting structure.

In this case, the first electrode 342 may include a transparent electrode 342a which comes into contact with the first semiconductor layer 322 of the first section 320, and a reflective electrode 342b between the transparent electrode 342 and the metal bonding layer 312.

When a part of light emitted from the first and second active layers 324 and 334 is directed to the support member 310, the reflective electrode 342b may reflect the light toward upper and lateral portions of the light emitting structure, thereby enhancing light extraction efficiency of the light emitting device 300.

To this end, the reflective electrode 342b may be formed of a material having good reflectivity. The reflective electrode 342b, for example, may be formed of at least one metal selected from among Ag, Ni, Al, Rh, Pd, Ir, Ru, Mg, Zn, Pt, Au and Hf or alloys thereof. Alternatively, the reflective electrode 342b may include multiple layers using the metal or alloys and a light transmissive conductive material, such as ITO, IZO, IZTO, IAZO, IGZO, IGTO, AZO, ATO and the like and more particularly, may be a stack of IZO/Ni, AZO/Ag, IZO/Ag/Ni, AZO/Ag/Ni, Ag/Cu, Ag/Pd/Cu or the like.

The transparent electrode 342a may diffuse current fed through the support member 310 toward the first semiconductor layer 342, may selectively include the light transmissive conductive layer and the metal layer. In one example, the transparent electrode 342a may be formed of at least one selected from among indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOz, RuOx, RuOx/ITO, Ni, Pt, Ru, Ir, Rh, Ta, Mo, Ti, Ag, W, Cu, Cr, Pd, V, Co, Nb, Zr, Ni/IrOx/Au and Ni/IrOx/Au/ITO and may have a single layer or multilayer form.

A protective insulating layer 314 may be disposed on an outer periphery of the first electrode 342. The protective insulating layer 314, for example, may be formed of at least one selected from among aluminum oxide ($Al_2O_3$), silicon oxide ($SiO_2$), silicon nitride ($Si_3N_4$), aluminum nitride (AlN) and titanium oxide ($TiO_x$).

The light emitting structure may have a second trench (not shown) formed in the first and second sections 320 and 330, and the second trench may extend from the first semiconductor layer 322 to the fourth semiconductor layer 336.

The second trench may have at least one shape selected from among a polygonal shape, a semicircular shape, a circular shape and a curved edge shape when viewed from the top, although the disclosure is not limited thereto.

Although the embodiment illustrates the second trench as being formed into the fourth semiconductor layer 336, the second trench may be formed onto a surface of the fourth semiconductor layer 336 from which the second active layer 334 has been removed, although the disclosure is not limited thereto.

In this case, a second electrode 344 may be disposed on an exposed region of the fourth semiconductor layer 336 within the second trench.

In this case, the second electrode 344 may have a depth equal to or greater than that of the second trench, although the disclosure is not limited thereto.

As the second electrode 344 is spaced apart from an inner lateral surface of the second trench, the second electrode 344 may gave a smaller width than the second trench.

The second electrode 344 may be electrically connected to the first electrode 342 disposed beneath the second trench.

The second electrode 344 may be electrically connected to the first electrode 342 and may have a width less than that of the first electrode 342, although the disclosure is not limited thereto.

A third electrode 346 is inserted into a hole (not shown) formed in the exposed region of the third semiconductor layer 332. As a part of the third electrode 346 is disposed on the exposed region of the third semiconductor layer 332 and the other part of the third electrode 346 is disposed on the second semiconductor layer 326, the second and third semiconductor layers 326 and 332 may be electrically connected to each other by the third electrode 346.

The third electrode 346 is identical to the third electrode 146 shown in FIGS. 1 and 2 and thus, a description thereof will be omitted.

Referring to FIG. 24, a second insulating layer 380 may be disposed between the second electrode 344 and the inner lateral surface of the second trench.

The second insulating layer 380 comes into contact with the inner lateral surface of the second trench and the second electrode 344, thereby advantageously preventing short circuit of the light emitting structure and consequently, achieving enhanced reliability.

The second insulating layer 380 may be formed of a light transmissive insulating material, for example, silicon, epoxy and the like, although the disclosure is not limited thereto.

The second insulating layer 380 may be selectively disposed on a part of or all the inner surface of the second trench, although the disclosure is not limited thereto.

Features described with reference to FIGS. 9 to 18 are applicable to the light emitting device 300 illustrated in the third embodiment and thus, a description thereof will be omitted.

Figure 25:
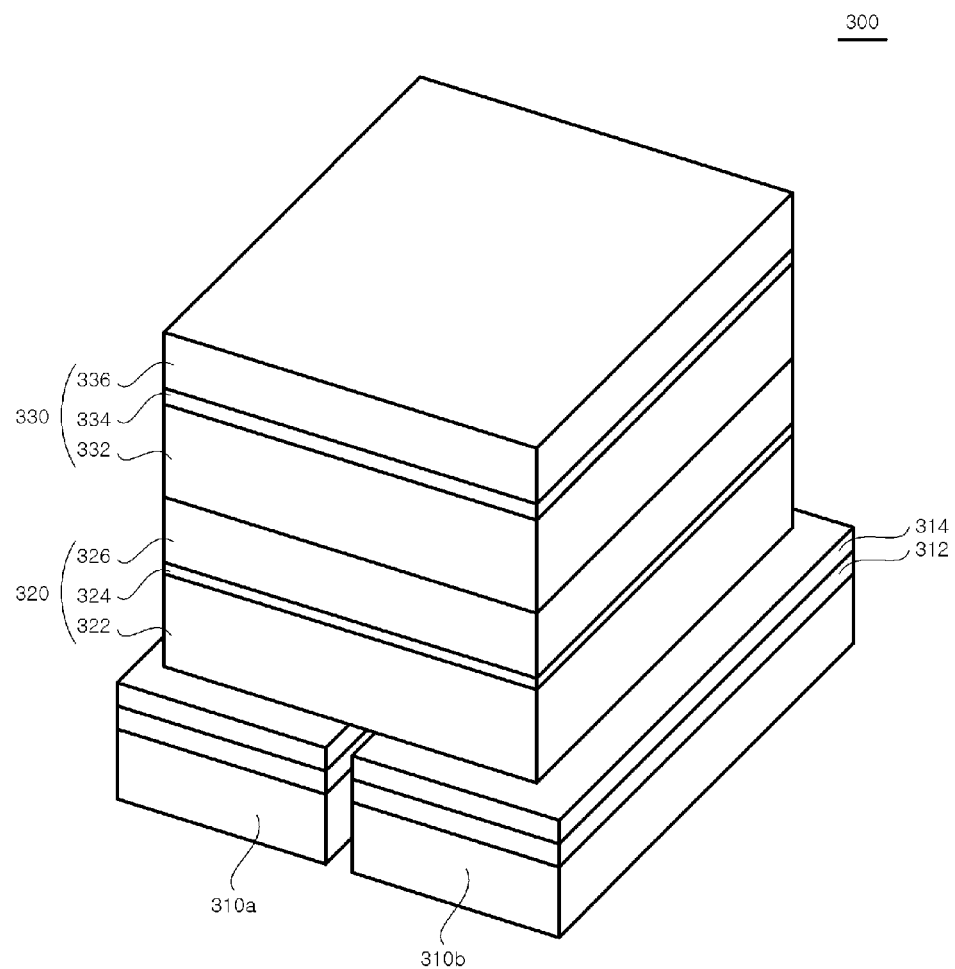
FIG. 25 is a perspective view showing a light emitting device in accordance with a fourth embodiment.
Figure 26:
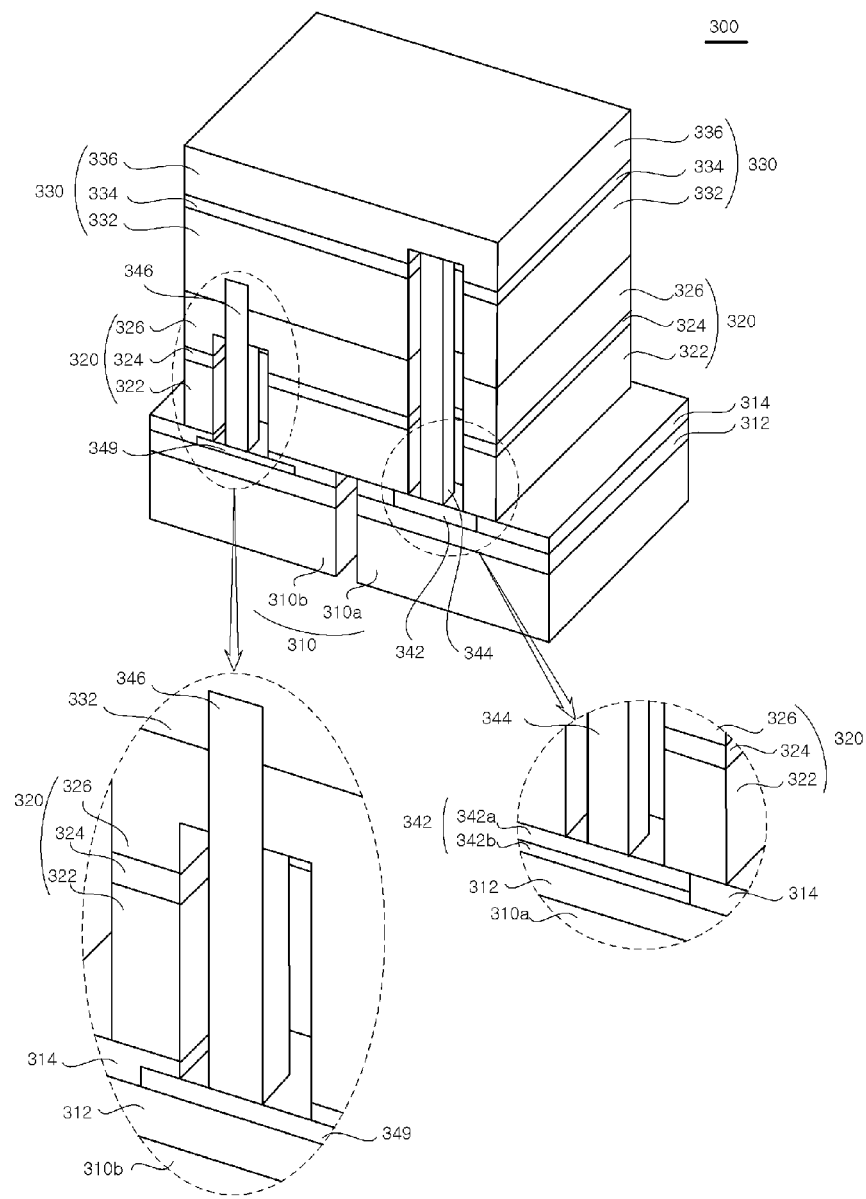
FIG. 26 is a perspective view showing a first alternative embodiment with respect to a cutting plane of the light emitting device shown in FIG. 25.
Figure 27:
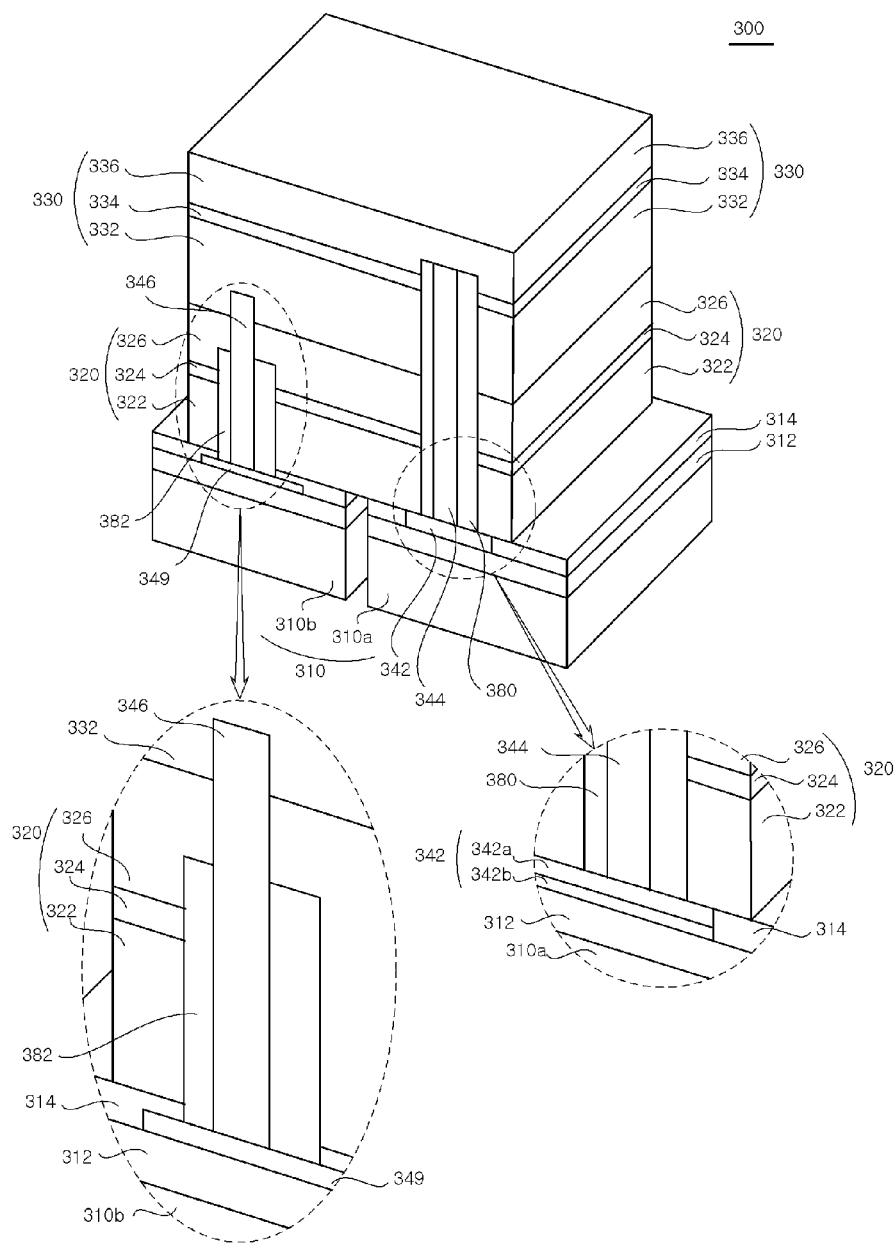
FIG. 27 is a perspective view showing a second alternative embodiment with respect to a cutting plane of the light emitting device shown in FIG. 25.

FIG. 25 is a perspective view showing a light emitting device in accordance with a fourth embodiment, FIG. 26 is a perspective view showing a first alternative embodiment with respect to a cutting plane of the light emitting device shown in FIG. 25, and FIG. 27 is a perspective view showing a second alternative embodiment with respect to the cutting plane of the light emitting device shown in FIG. 25.

In FIGS. 25 to 27, the configurations illustrated in FIGS. 1 and 2 and FIGS. 22 to 24 are briefly illustrated or omitted.

Referring to FIGS. 25 to 27, the light emitting device 300 may include the support member 310 and the light emitting structure (not shown) disposed on the support member 310. The light emitting structure may include the first section 320 and the second section 330 disposed on the first section 320. The first section 320 comprises the first semiconductor layer 322, the second semiconductor layer 326 and the first active layer 324 between the first and second semiconductor layers 322 and 326. The second section 330 comprises the third semiconductor layer 332, the fourth semiconductor layer 336 and the second active layer 334 between the third and fourth semiconductor layers 332 and 336.

The light emitting device 400 according to the fourth embodiment has a very similar configuration to the light emitting device 400 according to the fifth embodiment.

In this case, the support member 310 may include a first support portion 310a and a second support portion 310b spaced apart from the first support portion 310a.

A detailed description of the support member 310 will be omitted hereinafter because the support member 310 has been described in detail with reference to FIGS. 22 to 24.

The metal bonding layer 312 and the protective insulating layer 314 may be disposed on the support member 310. A detailed description of the metal bonding layer 312 and the protective insulating layer 314 will be omitted hereinafter because they have been described in detail with reference to FIGS. 22 to 24.

The light emitting structure (not shown) disposed on the first support 310a may be provided with the second trench (not shown). The first electrode 342 may be disposed between the first support portion 310a and the first semiconductor layer 322 that comes into contact with the first support portion 310a and the second electrode 344 may be disposed to electrically connect the first electrode 342 to the fourth semiconductor layer 336 that is exposed through the second trench. As such, the first and fourth semiconductor layers 322 and 336 may be electrically connected to each other.

A detailed description of the second trench and the first and second electrodes 342 and 344 will be omitted hereinafter because they have been described in detail with reference to FIGS. 22 to 24.

The light emitting structure disposed on the second support portion 310b may be provided with a third trench (not shown), which extends from the first semiconductor layer 322 to the third semiconductor layer 322.

Although the embodiment illustrates the third trench as being formed into the third semiconductor layer 322, the third trench may be formed onto a surface of the third semiconductor layer 332 from which the second semiconductor layer 326 has been removed, although the disclosure is not limited thereto.

In this case, the third electrode 346 may be disposed on exposed regions of the second and third semiconductor layers 326 and 332 within the third trench.

The third electrode 346 may have a length equal to or greater than a depth of the third trench, although the disclosure is not limited thereto.

The third electrode 346 may be spaced apart from a part of the third trench.

Specifically, the third trench may include a first trench portion (not shown) having a first width (not shown), the first trench portion extending from the first semiconductor layer 322 to a part of the second semiconductor layer 326 or the first active layer 324, and a second trench portion (not shown) having a second width (not shown) less than the first width, the second trench portion extending from a part of the second semiconductor layer 326 to a part of the third semiconductor layer 332.

As the third electrode 346 is spaced apart from the inner surface of the third trench and comes into contact with the inner surface of the second trench, current fed to the third electrode 346 may be diffused to the second and third semiconductor layers 326 and 332.

Referring to FIG. 27, the second insulating layer 380 may be disposed between the inner lateral surface of the second trench and the second electrode 344 and may serve to prevent short circuit between the light emitting structure and the second electrode 344. A description of the second insulating layer 380 will be omitted because the second insulating layer 380 has been described in detail with reference to FIG. 23.

A third insulating layer 382 may be disposed between the first trench portion of the third trench and the third electrode 346. The third insulating layer 382 may define a fourth trench (not shown) having a third width (not shown) and may serve to prevent short circuit between the light emitting structure and the third electrode 346.

The third width may be in a range of 1 to 1.5 times the width of the second width, although the disclosure is not limited thereto.

In this case, the third insulating layer 382 may be disposed on a part of the inner lateral surface of the third trench or on an exposed region of the third semiconductor layer 332 within the second trench, although the disclosure is not limited thereto.

The second and third insulating layers 280 and 382 may advantageously enhance reliability of the light emitting device 300.

In this case, a fourth electrode 349 may be disposed at a position corresponding to the fourth trench of the third insulating layer 382 so as to be electrically connected to the third electrode 346. The fourth electrode 349 may have a single layer or multilayer form.

Although the protective insulating layer 314 and the third insulating layer 382 disposed around the fourth electrode 349 are illustrated as being separated from each other, the protective insulating layer 314 and the third insulating layer 382 may be integrally formed with each other, although the disclosure is not limited.

The fourth electrode 349 may have the same configuration as the first electrode 342, or may be a transparent electrode or a reflective electrode, although the disclosure is not limited thereto.

Although not illustrated in the fourth embodiment, a second current limiting layer (not shown) may be formed between at least one of the first and fourth electrodes 342 and 349 and the light emitting structure, so as to prevent current crowding. The second current limiting layer may have the same characteristics as those of the first current limiting layer 162 shown in FIG. 13, although the disclosure is not limited thereto.

Features described with reference to FIGS. 9 to 18 are applicable to the light emitting device 300 illustrated in the fourth embodiment and thus, a description thereof will be omitted.

Although the light emitting devices 100 and 200 illustrated in the first and second embodiments are of a horizontal type, these light emitting devices 100 and 200 may be flip chip bonded to a light emitting device package, although the disclosure is not limited thereto.

Figure 28:
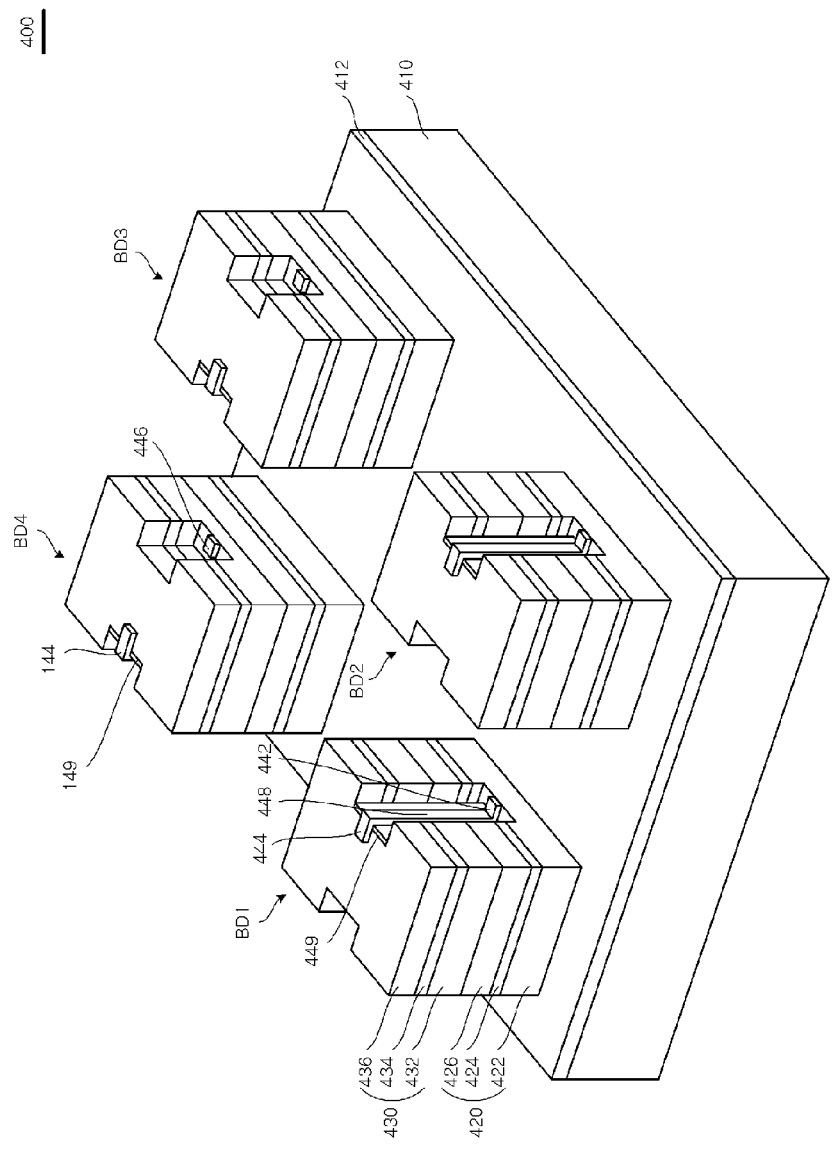
FIG. 28 is a perspective view showing a light emitting device in accordance with a fifth embodiment.
Figure 29:
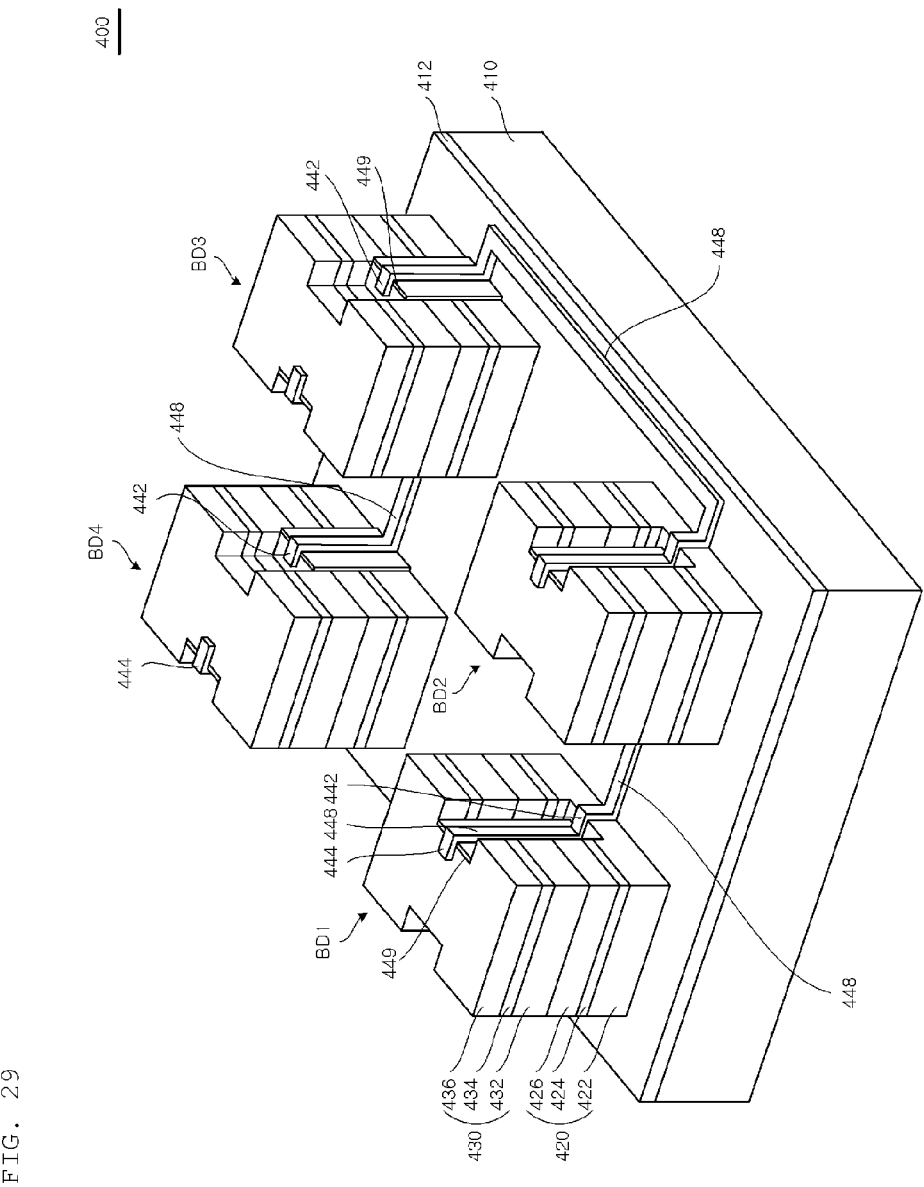
FIG. 29 is a perspective view showing an embodiment with respect to a connecting method of first to fourth light emitting cells shown in FIG. 28.

FIG. 28 is a perspective view showing a light emitting device in accordance with a fifth embodiment, and FIG. 29 is a perspective view showing an embodiment with respect to a connecting method of first to fourth light emitting cells shown in FIG. 28.

Referring to FIG. 28, the light emitting device 400 may include a support member 410 and first and second sections 420 and 430 disposed on the support member 410. The light emitting device 400 may include a light emitting structure divided into first to fourth light emitting cells BD1 to BD4.

The support member 410 may be formed of the same material as at least one of the support members 110, 210 and 310 illustrated in the first to fourth embodiments and will be described as a non-conductive support member in the fifth embodiment.

A buffer layer 412 may be disposed on the support member 410 and may serve to relieve lattice mismatch between the support member 410 and the light emitting structure and to ensure easy growth of a plurality of semiconductor layers.

A description of the buffer layer 412 will be omitted hereinafter because the buffer layer 412 has been described with reference to FIGS. 1 and 2.

Although the light emitting structure is illustrated as being divided into the first to fourth light emitting cells BD1 to BD4 having the same configuration, the first to fourth light emitting cells BD1 to BD4 may have different in at least one of a configuration, size, width and thickness. Of course, the disclosure is not limited thereto.

In this case, the first to fourth light emitting cells BD1 to BD4 divided in the light emitting structure are illustrated as having the same configuration as the light emitting structure shown in FIGS. 1 and 2, although the disclosure is not limited thereto.

Accordingly, a description of the first to fourth light emitting cells BD1 to BD4 will be omitted hereinafter.

A first electrode 442 may be disposed on a first semiconductor layer 422, a second electrode 444 may be disposed on a fourth semiconductor layer 436, and a third electrode 446 may be disposed on both second and third semiconductor layers 426 and 432.

The first electrode 442 may be disposed on a non-overlapping region (not shown) of the first semiconductor layer 422 where the first semiconductor layer 422 does not overlap with a first active layer 424, the second semiconductor layer 426 and the second section 430 and is exposed to the outside.

In this case, the non-overlapping region may be obtained by etching lateral surfaces of the first and second sections 420 and 430 to expose a part of the first semiconductor layer 422 to the outside, although the disclosure is not limited thereto.

The second electrode 444 may be disposed on the fourth semiconductor layer 436 and may be electrically connected to the first electrode 442 via a wire (not shown) and a connecting electrode (not shown).

The third electrode 446 may be inserted into the hole (not shown) perforated in the exposed region of the third semiconductor layer 432, such that a part of the third electrode 446 is disposed on the exposed region of the third semiconductor layer 432 and the other part is disposed on the second semiconductor layer 426. As such, the third electrode 446 may electrically connect the second and third semiconductor layers 426 and 432 to each other.

The exposed region of the third semiconductor layer 432 may be etched in the same manner as the above described non-overlapping region of the first semiconductor layer 422, although the disclosure is not limited thereto.

Specifically, although the third electrode 446 is illustrated as being disposed on a surface of the second semiconductor layer 426, the third electrode 446 may be disposed in the second semiconductor layer 426.

The first to third electrodes 442, 444 and 446 may be formed of a conductive material, for example, a metal selected from among In, Co, Si, Ge, Au, Pd, Pt, Ru, Re, Mg, Zn, Hf, Ta, Rh, Ir, W, Ti, Ag, Cr, Mo, Nb, Al, Ni, Cu and WTi, or may contain alloys thereof, and may contain a light transmissive conductive material, such as IZO, IZTO, IAZO, IGZO, IGTO, AZO, ATO and the like, as well as the metal, although the disclosure is not limited thereto.

At least one of the first to third electrodes 442, 444 and 446 may have a single layer or multi-layer form, although the disclosure is not limited thereto.

As illustrated in FIG. 29, a connecting electrode 448 may be provided to electrically connect the first and second electrodes 442 and 444 and the first to fourth light emitting cells BD1 to BD4 to one another.

A protective insulating layer 449 may be formed on at least one lateral surface of the first and second sections 420 and 430. The connecting electrode 448 may be disposed on a lateral surface of the protective insulating layer 449 and may serve to prevent short circuit of the first and second sections 420 and 430.

Although the first to fifth light emitting cells BD1 to BD4 are shown in FIG. 29 as being connected to one another in series, the first to fifth light emitting cells BD1 to BD4 may have a parallel connection or a combination of serial and parallel connections. Of course, the disclosure is not limited thereto.

As at least one light emitting cell may be disposed between the first and second light emitting cells BD1 and BD2 and the third and fourth light emitting cells BD3 and BD4, the first and second light emitting cells BD1 and BD2 may define an array and the third and fourth light emitting cells BD3 and BD4 may define an array.

Specifically, the light emitting device 400 may be configured in such a way that a plurality of arrays defines a plurality of matrixes and may exhibit a serial connection, a parallel connection or a combination of serial and parallel connections according to a coupling method of the respective light emitting cells.

In this case, the light emitting cells of the light emitting device 400 may have a zigzag or concentric arrangement according to an electrode connection manner of at least two or more light emitting cells.

In other words, the light emitting device 400 shown in FIG. 28 has the light emitting structure divided into the first to fourth light emitting cells BD1 to BD4 and the light emitting structure has the same configuration as that of the light emitting device 100 according to the first embodiment.

However, it is noted that the light emitting structure of the light emitting device 400 divided into the first to fourth light emitting cells BD1 to BD4 may have the same configuration as the light emitting devices 200 and 300 according to the second to fourth embodiments, although the disclosure is not limited thereto.

Figure 30:
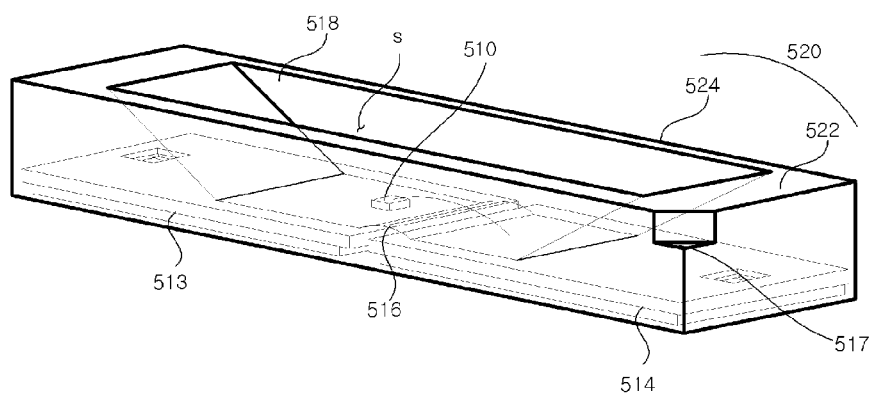
FIG. 30 is a perspective view showing a light emitting device package comprising a light emitting device in accordance with an embodiment.

FIG. 30 is a perspective view showing a light emitting device package comprising a light emitting device in accordance with an embodiment.

Although FIG. 30 illustrates a top view type light emitting device package, the disclosure is not limited thereto and is applicable to a side view type light emitting device package.

Referring to FIG. 30, the light emitting device package 500 may include a light emitting device 510 and a body 520 in which the light emitting device 510 is disposed.

The body 520 may include a first partition 522 arranged in a first direction (not shown) and a second partition 524 arranged in a second direction (not shown) perpendicular to the first direction. The first and second partitions 522 and 524 may be integrally formed with each other and may be formed by injection molding, etching or the like, although the disclosure is not limited thereto.

The first and second partitions 522 and 524 may be formed of at least one selected from among a resin, such as polyphthalamide (PPA), silicon (Si), aluminum (Al), aluminum nitride (AlN), $AlO_x$, Photo Sensitive Glass (PSG), polyamide 9T (PA9T), syndiotactic polystyrene (SPS), metal, sapphire ($Al_2O_3$), beryllium oxide (BeO), ceramic and a printed circuit board.

Upper surfaces of the first and second partitions 522 and 524 may have various shapes comprising, e.g., a triangular shape, a tetragonal shape, a polygonal shape and a circular shape according to the use purpose and design of the light emitting device 510, although the disclosure is not limited thereto.

The first and second partitions 522 and 524 define a cavity s in which the light emitting device 510 is disposed. The vertical cross section of the cavity s may have a cup shape, a concave container shape or the like. The first and second partitions 522 and 524 forming the cavity s may be inclined downward and may be provided at an inner surface thereof with an uneven structure, although the disclosure is not limited thereto.

The cavity s may have various shapes comprising, e.g., a triangular shape, a tetragonal shape, a polygonal shape and a circular shape when viewed from the top, although the disclosure is not limited thereto.

First and second lead frames 513 and 514 may be disposed on a bottom surface of the body 520. The first and second lead frames 513 and 514 may be formed of a metal, for example, at least one selected from among Ti, Cu, Ni, Au, Cr, Ta, Pt, Sn, Ag, P, Al, In, Pd, Co, Si, Ge, Hf, Ru and Fe and alloys thereof.

The first and second lead frames 513 and 514 may have a single layer or multilayer form, although the disclosure is not limited thereto.

Inner lateral surfaces of the first and second partitions 522 and 524 may be inclined by a predetermined angle on the basis of any one of the first and second lead frames 513 and 514. A reflection angle of light emitted from the light emitting device 510 may vary according to the inclination angle, which enables adjustment of an orientation angle of light to be emitted to the outside. Concentration of light to be emitted from the light emitting device 510 to the outside may increase as the orientation of light is reduced, but may decrease as the orientation of light is increased.

The inner lateral surface of the body 520 may have various inclination angles, although the disclosure is not limited thereto.

The first and second lead frames 513 and 514 may be electrically connected to the light emitting device 510 and may also be connected respectively to positive and negative electrodes of an external power source (not shown), thereby serving to apply power to the light emitting device 510.

In the embodiment, the light emitting device 510 may be disposed on the first lead frame 513 and the second lead frame 514 may be spaced apart from the first lead frame 513. Specifically, the light emitting device 510 may be die bonded to the first lead frame 513 and be wire bonded to the second lead frame 514 via a wire (not shown), so as to receive power from the first and second lead frames 513 and 514.

At least one of the first and second lead frames 513 and 514 may be provided with a protrusion or recess for installation of the light emitting device 510, although the disclosure is not limited thereto.

The light emitting device 510 may be bonded to the first lead frame 513 and the second lead frame 514 with different polarities.

The light emitting device 510 may be wire bonded or die bonded respectively to the first and second lead frames 513 and 514, although a connection method is not limited thereto.

Although the light emitting device 510 of the embodiment is described as being disposed on the first lead frame 513, the disclosure is not limited thereto.

The light emitting device 510 may be attached to an adhesive member (not shown) on the first lead frame 513.

An insulator 516 may be formed between the first and second lead frames 513 and 514, to prevent short circuit of the first and second lead frames 513 and 514.

Although the embodiment exemplifies the insulator 516 having a semicircular upper portion, the shape of the upper portion may be changed according to an injection molding method, and the disclosure is not limited thereto.

The body 520 may be provided with a cathode mark 517. The cathode mark 517 may be used to assist in easily distinguishing the polarity of the light emitting device 510, i.e. the polarity of the first and second lead frames 513 and 514, thereby preventing confusion of the first and second lead frames 513 and 514 upon electric connection thereof.

The light emitting device 510 may be a light emitting diode. The light emitting diode, for example, may be a colored light emitting diode to emit red, green, blue or white light, or may be an ultraviolet light emitting diode, although the disclosure is not limited thereto. In addition, a plurality of light emitting devices 510 may be mounted on the first lead frame 513, and at least one light emitting device 510 may be mounted on each of the first and second lead frames 513 and 514. The light emitting devices 510 have no limit in terms of the number and position thereof.

The body 520 may include a resin material 518 filled in the cavity s. Specifically, the resin material 518 may have a double molded structure or a triple molded structure, although the disclosure is not limited thereto.

The resin material 518 may take the form of a film and may include at least one of a fluorescent substance and a light diffuser, or may be formed of a light transmissive material having no fluorescent substance or light diffuser, although the disclosure is not limited thereto.

Figure 31:
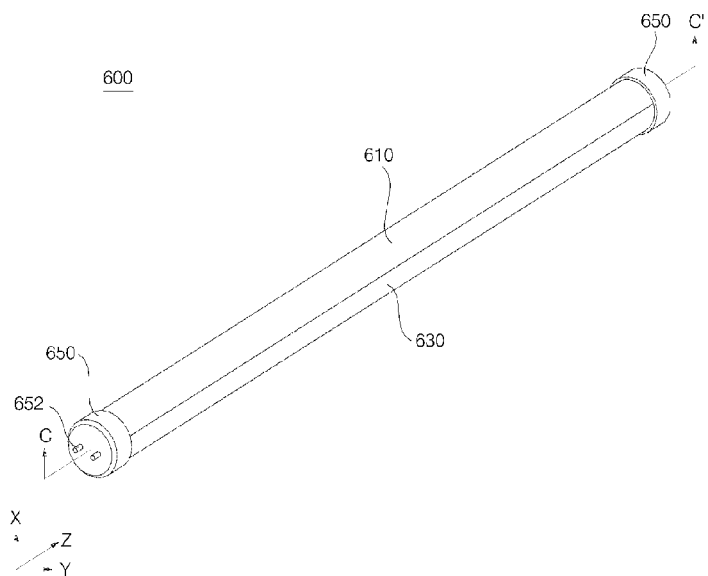
FIG. 31 is a perspective view showing a lighting apparatus comprising a light emitting device in accordance with an embodiment.
Figure 32:
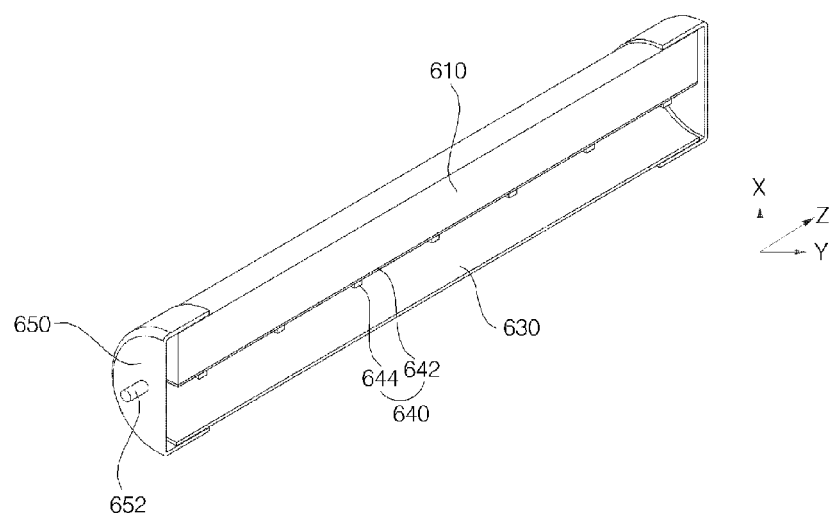
FIG. 32 is a sectional view taken along the line C-C' of the lighting apparatus of FIG. 31.

FIG. 31 is a perspective view showing a lighting apparatus comprising a light emitting device in accordance with an embodiment, and FIG. 32 is a sectional view taken along the line C-C' of the lighting apparatus of FIG. 31.

Referring to FIGS. 31 and 32, a lighting apparatus 600 may include a body 610, a cover 630 coupled to the body 610 and end caps 650 located at opposite ends of the body 610.

A light emitting device module 640 may be coupled to a lower surface of the body 610. The body 610 may be formed of a metal material having excellent conductivity and heat radiation effects, to discharge heat generated in light emitting device packages 644 to the outside through an upper surface of the body 610.

The light emitting device packages 644 may have multiple colors and may be arranged in multiple rows on a printed circuit board 642 to form an array. Also, the light emitting device packages 644 may be arranged by the same distance or by different distances as occasion demands, to enable adjustment of brightness. The printed circuit board 642 may be formed of a Metal Core PCB (MCPCB), FR4 PCB or the like.

The light emitting device packages 644 may include a lead frame (not shown) to have an enhanced radiation function. Therefore, the reliability and efficiency of the light emitting device packages 644 may be enhanced, and the lifespan of the lighting apparatus 600 comprising the light emitting device packages 644 as well as the lifespan of the light emitting device packages 644 may be extended.

The cover 630 may have a circular shape to surround the lower surface of the body 610, although the disclosure is not limited thereto.

The cover 630 protects the light emitting device module 640 from external foreign substances, etc. The cover 630 may contain diffusive particles to prevent glare of light emitted from the light emitting device packages 644 and to ensure uniform emission of light to the outside. A prism pattern may be formed on at least one of an inner surface and an outer surface of the cover 630. Additionally, a fluorescent substance may be applied to at least one of the inner surface and the outer surface of the cover 630.

As the light emitted from the light emitting device packages 644 is discharged to the outside through the cover 630, the cover 630 must have not only excellent light transmittance, but also heat resistance sufficient to endure heat generated from the light emitting device packages 644. The cover 630 may be formed of Polyethylene Terephthalate (PET), Polycarbonate (PC), PolymethylMethacrylate (PMMA) or the like.

The end caps 650 may be located at opposite ends of the body 610 and serve to hermetically seal a power device (not shown). The end caps 650 may be provided with power pins 652, which allows the lighting apparatus 600 in accordance with the embodiment to be directly used in a terminal, from which an existing fluorescent lamp has been removed, without requiring a separate device.

Figure 33:
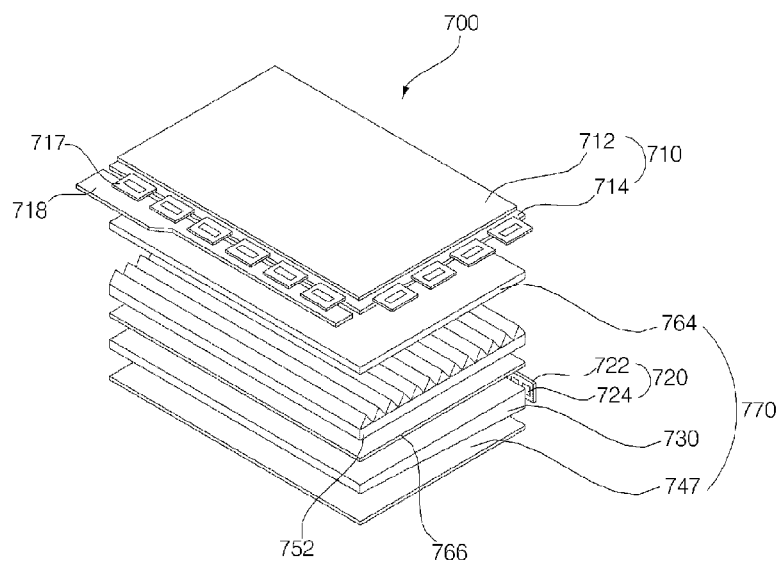
FIG. 33 is an exploded perspective view showing a liquid crystal display apparatus comprising a light emitting device in accordance with an embodiment.

FIG. 33 is an exploded perspective view of a liquid crystal display apparatus comprising a light emitting device in accordance with an embodiment.

FIG. 33 illustrates an edge light type liquid crystal display apparatus 700, which may include a liquid crystal display panel 710 and a backlight unit 770 to irradiate light to the liquid crystal display panel 710.

The liquid crystal display panel 710 may display an image using light generated from the backlight unit 770. The liquid crystal display panel 710 may include a color filter substrate 712 and a thin film transistor substrate 714, which are arranged to face each other with liquid crystals interposed therebetween.

The color filter substrate 712 may realize the color of the image displayed via the liquid crystal display panel 710.

The thin film transistor substrate 714 is electrically connected to a printed circuit board 718, on which a plurality of circuit elements is mounted, by means of a drive film 717. The thin film transistor substrate 714 may apply drive voltage, provided by the printed circuit board 718, to the liquid crystals in response to a drive signal transmitted from the printed circuit board 718.

The thin film transistor substrate 714 may include pixel electrodes and thin film transistors in the form of thin films formed on another substrate formed of a transparent material, such as glass, plastic or the like.

The backlight unit 770 comprises a light emitting device module 720 to emit light, a light guide plate 730 to change light emitted from the light emitting device module 720 into planar light and transmit the planar light to the liquid crystal display panel 710, a plurality of films 750, 764 and 766 to achieve uniformity in brightness distribution and improve vertical light incidence of the light having passed through the light guide plate 730, and a reflective sheet 740 to reflect light, emitted rearward from the light guide plate 730, toward the light guide plate 730.

The light emitting device module 720 may include a plurality of light emitting device packages 724 and a printed circuit board 722 on which the plurality of light emitting device packages 724 is mounted to define an array.

The backlight unit 770 may include the diffusive film 766, which diffuses incident light from the liquid guide plate 730 toward the liquid display panel 710, and the prism film 750 which condenses the diffused light to enhance vertical incidence. The prism film 750 may include the protective film 764 to protect the prism film 750.

Figure 34:
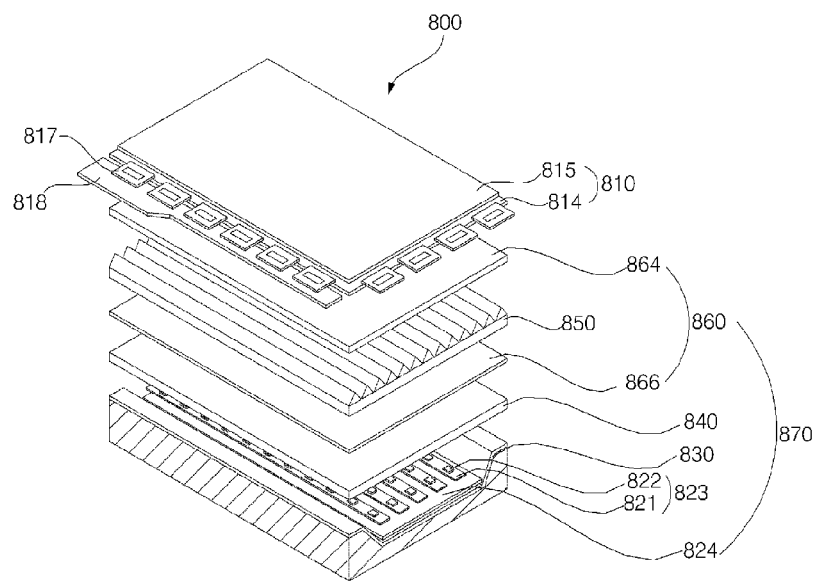
FIG. 34 is an exploded perspective view showing a liquid crystal display apparatus comprising a light emitting device in accordance with an embodiment.

FIG. 34 is an exploded perspective view of a liquid crystal display apparatus comprising a light emitting device in accordance with an embodiment. The same configuration as that illustrated and described in FIG. 33 will not be repeated hereinafter.

FIG. 34 illustrates a vertical type liquid crystal display apparatus 800, which may include a liquid crystal display panel 810 and a backlight unit 870 to irradiate light to the liquid crystal display panel 810.

The liquid crystal display panel 810 is identical to the description with reference to FIG. 33 and thus, a detailed description thereof will be omitted.

The backlight unit 870 may include a plurality of light emitting device modules 823, a reflective sheet 824, a lower chassis 830 in which the light emitting device modules 823 and the reflective sheet 824 are accommodated, a diffusive plate 840 and a plurality of optical films 860 disposed above the light emitting device modules 823.

Each of the light emitting device modules 823 may include a plurality of light emitting device packages 822 and a printed circuit board 821 on which the plurality of light emitting device packages 822 is mounted to form an array.

The reflective sheet 824 serves to reflect light emitted from the light emitting device packages 822 toward the liquid crystal display panel 810, thereby improving use efficiency of the light.

The light emitted from the light emitting device modules 823 is introduced into the diffusive plate 840, and optical films 860 are disposed above the diffusive plate 840. The optical films 860 may include a diffusive film 866, a prism film 850 and a protective film 864.

Here, the lighting apparatus 600 and the liquid crystal display apparatuses 700 and 800 may be included in a lighting system and other devices, which include light emitting device packages and serve as lights, may further be included in the lighting system.

In addition, in the light emitting device according to one of the embodiments, the light emitting device may emit light upon receiving both the forward bias and the reverse bias from the AC power source AC.

Accordingly, the light emitting device does not need a separate rectifier circuit during supply of AC power, and the number of the light emitting devices may be determined according to the voltage consumed by the light emitting devices, although the disclosure is not limited thereto.

Also, the light emitting device in the form of a single chip may emit light upon receiving both the forward bias and the reverse bias, thereby exhibiting enhanced light emission efficiency on a per unit area basis thereof.

Further, since the light emitting device defines the current passage path with respect to the forward bias and the reverse bias, the light emitting device may be free from damage due to Electro Static Discharge (ESD) and may do not require a separate ESD protecting device.

Particular features, structures, or characteristics described in connection with the embodiment are included in at least one embodiment of the present disclosure and not necessarily in all embodiments. Furthermore, the particular features, structures, or characteristics of any specific embodiment of the present disclosure may be combined in any suitable manner with one or more other embodiments or may be changed by those skilled in the art to which the embodiments pertain. Therefore, it is to be understood that contents associated with such combination or change fall within the spirit and scope of the present disclosure.

Although embodiments have been described with reference to a number of illustrative embodiments thereof, it should be understood that numerous other modifications and applications may be devised by those skilled in the art that will fall within the intrinsic aspects of the embodiments. More particularly, various variations and modifications are possible in concrete constituent elements of the embodiments. In addition, it is to be understood that differences relevant to the variations and modifications fall within the spirit and scope of the present disclosure defined in the appended claims.

What is claimed is:

1. A light emitting device comprising:
a light emitting structure comprising a first section and a second section, wherein the first section comprises a first semiconductor layer doped with a first dopant, a second semiconductor layer doped with a second dopant, and a first active layer between the first and second semiconductor layers, and wherein the second section comprises a third semiconductor layer disposed on the first section and doped with the first dopant, the third semiconductor layer having an exposed region, a fourth semiconductor layer disposed on the third semiconductor layer except for the exposed region and doped with the second dopant, and a second active layer between the third and fourth semiconductor layers;
a first electrode disposed on the first semiconductor layer;
a second electrode disposed on the fourth semiconductor layer; and
a third electrode inserted into a hole penetrating the exposed region of the third semiconductor vertically so as to be disposed on the exposed region and the second semiconductor layer, the third electrode electrically connected to the second and third semiconductor layers,
wherein the second semiconductor layer and the third semiconductor layer are directly contacted with each other.

2. The light emitting device of claim 1, wherein a thickness of the first section is equal to or greater than a thickness of the second section.

3. The light emitting device of claim 1, wherein a depth of the hole is 1 to 3 times than a thickness of the third semiconductor layer.

4. The light emitting device of claim 1, wherein a width of the hole is 0.3 to 0.9 times less than a width of the exposed region.

5. The light emitting device of claim 1, wherein the second semiconductor layer is formed at a recess at a position corresponding to the hole, and
wherein a width of the recess is 0.5 to 1 times than a width of the hole.

6. The light emitting device of claim 1, further comprising:
a connecting electrode to electrically connect the first and second electrodes.

7. The light emitting device of claim 1, further comprising a light transmissive electrode layer between the fourth semiconductor layer and the second electrode.

8. The light emitting device of claim 7, wherein the light transmissive electrode layer comprises a hole at a position thereof corresponding to the second electrode.

9. The light emitting device of claim 8, wherein the second electrode is disposed on a surface of the light transmissive electrode layer and on a surface of the fourth semiconductor layer that is exposed through the hole perforated in the light transmissive electrode layer.

10. The light emitting device of claim 9, further comprising a first current limiting layer included in the light transmissive electrode layer.

11. A light emitting device comprising:
a light emitting structure comprising a first section and a second section, wherein the first section comprises a first semiconductor layer doped with a first dopant, a second semiconductor layer doped with a second dopant, and a first active layer between the first and second semiconductor layers, wherein the second section comprises a third semiconductor layer disposed on the first section and doped with the first dopant, the third semiconductor layer having an exposed region, a fourth semiconductor layer disposed on the third semiconductor layer except for the exposed region and doped with the second dopant, and a second active layer between the third and fourth semiconductor layers, and wherein a first trench is formed from the fourth semiconductor layer to the first semiconductor layer;
a first electrode inserted into the first trench so as to be disposed on an exposed portion of the first semiconductor layer within the first trench;
a second electrode electrically connected to the fourth semiconductor layer and the first electrode; and
a third electrode inserted into a hole penetrating the exposed region of the third semiconductor vertically so as to be disposed on the exposed region and the second semiconductor layer, the third electrode electrically connected to the second and third semiconductor layers, wherein the second semiconductor layer and the third semiconductor layer are directly contacted with each other.

12. A light emitting device comprising:
a conductive support member comprising a first support portion and a second support portion spaced from the first support portion;
a light emitting structure comprising a first section and a second section, wherein the first section comprises a first semiconductor layer disposed on the first and second support portions and doped with a first dopant, a second semiconductor layer doped with a second dopant, and a first active layer between the first and second semiconductor layers, wherein the second section comprises a third semiconductor layer disposed on the first section and doped with the first dopant, a fourth semiconductor layer disposed on the third semiconductor layer and doped with the second dopant, and a second active layer between the third and fourth semiconductor layers, wherein a second trench is formed on the first support portion to extend from the first semiconductor layer to the fourth semiconductor layer, and wherein a third trench is formed on the second support portion to extend from the first semiconductor layer to the third semiconductor layer;
a first electrode disposed between the first support portion and the first semiconductor layer, and the first electrode electrically connected to the first support portion and the first semiconductor layer;
a second electrode disposed in the second trench, and electrically connected to the fourth semiconductor layer and the first electrode; and
a third electrode disposed to come into contact with exposed portions of the second and third semiconductor layers within the third trench, the third electrode electrically connected to the second and third semiconductor layers,
wherein the third electrode inserted into a hole penetrating the exposed region of the third semiconductor vertically so as to be disposed on the exposed region and the second semiconductor layer, the third electrode electrically connected to the second and third semiconductor layers,
wherein the second semiconductor layer and the third semiconductor layer are directly contacted with each other.

13. The light emitting device of claim 12, wherein the third trench comprises:
a first trench portion having a first width and the first trench portion is formed from the first semiconductor layer to a part of the second semiconductor layer or the first active layer; and
a second trench portion having a second width less than the first width and the second trench portion is formed from a part of the second semiconductor layer to a part of the third semiconductor layer.

14. The light emitting device of claim 13, further comprising:
a third insulating layer disposed between the second support portion and the first semiconductor layer and on an inner lateral surface of the first trench portion, and the third insulating layer forming a fourth trench having a third width, and
wherein the third width is 1 to 1.5 times than the second width.

15. The light emitting device of claim 14, further comprising:
a fourth electrode disposed on a position corresponding to the fourth trench of the third insulating layer, and the fourth electrode electrically connect the second support portion and the third electrode.

16. The light emitting device of claim 12, further comprising a light transmissive electrode layer between the fourth semiconductor layer and the second electrode.

17. The light emitting device of claim 16, wherein the light transmissive electrode layer comprises a hole at a position thereof corresponding to the second electrode.

18. The light emitting device of claim 17, wherein the second electrode is disposed on a surface of the light transmissive electrode layer and on a surface of the fourth semiconductor layer that is exposed through the hole perforated in the light transmissive electrode layer.

19. The light emitting device of claim 18, further comprising a first current limiting layer included in the light transmissive electrode layer.

\* \* \* \* \*